United States Patent
Shim et al.

(10) Patent No.: US 8,563,378 B2
(45) Date of Patent: Oct. 22, 2013

(54) MANUFACTURING SEMICONDUCTOR DEVICES

(75) Inventors: Jae-Joo Shim, Suwon-si (KR); Han-Soo Kim, Suwon-si (KR); Won-Seok Cho, Suwon-si (KR); Jae-Hoon Jang, Seongnam-si (KR); Sang-Yong Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/238,104

(22) Filed: Sep. 21, 2011

(65) Prior Publication Data

US 2012/0077320 A1 Mar. 29, 2012

(30) Foreign Application Priority Data

Sep. 27, 2010 (KR) .................. 10-2010-0093165

(51) Int. Cl.
 *H01L 21/336* (2006.01)
(52) U.S. Cl.
 USPC .......................................... 438/268; 257/302
(58) Field of Classification Search
 USPC .......................................... 438/268; 257/302
 See application file for complete search history.

(56) References Cited

U.S. PATENT DOCUMENTS

2011/0156132 A1* 6/2011 Kiyotoshi ..................... 257/326
2011/0291172 A1* 12/2011 Hwang et al. ................. 257/314

FOREIGN PATENT DOCUMENTS

| JP | 2009-212280 A | 9/2009 |
| JP | 2009-224612 A | 10/2009 |
| JP | 2010-045314 A | 2/2010 |

* cited by examiner

*Primary Examiner* — Zandra Smith
*Assistant Examiner* — Jamie C Niesz
(74) *Attorney, Agent, or Firm* — Lee & Morse, P.C.

(57) ABSTRACT

A semiconductor device includes a semiconductor pattern on a substrate, gate structures on sidewalls of the semiconductor pattern, the gate structures being spaced apart from one another, insulating interlayers among the gate structures, wherein an uppermost insulating interlayer is lower than an upper face of the semiconductor pattern, a common source line contacting the substrate and protruding above the uppermost insulating interlayer, an etch stop layer pattern on the semiconductor pattern and on the common source line wherein the common source line protrudes above the uppermost insulating interlayer, an additional insulating interlayer on the uppermost insulating interlayer, and contact plugs extending through the additional insulating interlayer so as to make contact with the semiconductor pattern and the common source line, respectively.

13 Claims, 21 Drawing Sheets

MANUFACTURING SEMICONDUCTOR DEVICES

BACKGROUND

1. Field

Example embodiments relate to semiconductor devices and methods of manufacturing semiconductor devices.

2. Description of the Related Art

To provide a high degree of integration in a semiconductor device, memory cells in the semiconductor device may be stacked on a substrate in a direction vertical to the substrate. A stacked memory device may include a bit line contacting a semiconductor pattern. However, a high degree of integration may make it more difficult to align features of the memory device, e.g., the bit line and the semiconductor pattern.

SUMMARY

An embodiment is directed to a method of manufacturing a semiconductor device, the method including alternately forming insulating interlayers and sacrificial layers on a substrate, the insulating interlayers and the sacrificial layers having a first opening exposing the substrate, forming a semiconductor pattern in the first opening, the semiconductor pattern contacting the substrate and protruding above an uppermost insulating interlayer, forming a second opening through the insulating interlayers and the sacrificial layers, the second opening exposing a portion of the substrate adjacent to the semiconductor pattern, forming grooves among the insulating interlayers by selectively removing the sacrificial layers, the grooves partially exposing sidewalls of the semiconductor pattern, forming gate structures in the grooves, respectively, forming a common source line in the second opening, the common source line contacting the substrate and protruding above the uppermost insulating interlayer, forming an etch stop layer pattern on the semiconductor pattern wherein the semiconductor pattern may protrude above the uppermost insulating interlayer and on the common source line and wherein the common source line may protrude above the uppermost insulating interlayer, forming an additional insulating interlayer on the uppermost insulating interlayer, and forming contact plugs through the additional insulating interlayer, the contact plugs contacting the semiconductor pattern and the common source line, respectively.

The etch stop layer pattern may be formed using silicon nitride.

The method may further include forming a buffer layer on the uppermost insulating interlayer, the semiconductor pattern, and the common source line before forming the etch stop layer pattern.

Forming the etch stop layer pattern may include forming an etch stop layer on the uppermost insulating interlayer, the semiconductor pattern, and the common source line, and partially etching the etch stop layer to form the etch stop layer pattern on sidewalls of the semiconductor pattern and the common source line.

The etch stop layer pattern may be formed on the uppermost insulating interlayer, the semiconductor pattern, and the common source line.

Forming the common source line may include forming an insulation layer filling the second opening, partially etching the insulation layer in the second opening to form an insulation layer pattern on a sidewall of the second opening, and forming a conductive layer to fill the second opening.

The method may further include doping impurities into an upper portion of the semiconductor pattern.

Forming the semiconductor pattern may include forming a semiconductor layer on a sidewall of the first opening, forming a filling layer on the semiconductor layer to fill the first opening, partially removing the semiconductor layer and the filling layer to form a first semiconductor pattern and a filling layer pattern in the first opening, wherein the first semiconductor pattern may be substantially lower than an upper end of the first opening, and forming a second semiconductor pattern on the first semiconductor pattern and the filling layer pattern.

Forming the gate structures may include forming a tunnel insulation layer, a charge storing layer, and a blocking dielectric layer on the grooves in the second opening, forming a conductive layer on the blocking dielectric layer, and partially removing the conductive layer to form control gates in the grooves.

Another embodiment is directed to a semiconductor device, including a semiconductor pattern on a substrate, gate structures on sidewalls of the semiconductor pattern, the gate structures being spaced apart from one another, insulating interlayers among the gate structures, wherein an uppermost insulating interlayer may be substantially lower than an upper face of the semiconductor pattern, a common source line contacting the substrate and protruding above the uppermost insulating interlayer, an etch stop layer pattern on the semiconductor pattern and on the common source line wherein the common source line may protrude above the uppermost insulating interlayer, an additional insulating interlayer on the uppermost insulating interlayer, and contact plugs, the contact plugs extending through the additional insulating interlayer so as to make contact with the semiconductor pattern and the common source line, respectively.

The etch stop layer pattern may have a spacer shape, the spacer shape being disposed on sidewalls of the semiconductor pattern and on sidewalls of the common source line wherein the common source line may protrude above the uppermost insulating interlayer.

The etch stop layer pattern may be disposed along the uppermost insulating interlayer, the semiconductor pattern, and the common source line.

The semiconductor device may further include a filling layer pattern disposed on an inside of the semiconductor pattern.

The gate structures may include a tunnel insulation layer pattern, a charge storing layer pattern, a blocking dielectric layer pattern, and control gates.

The control gates may extend along a direction parallel to the substrate, and a control gate at a lower level may extend more than a control gate at an upper level. End portions of the control gates may respectively make contact with pad contacts, the pad contacts being disposed through the upper insulating interlayer and at least one of the insulating interlayers.

Another embodiment is directed to a method of forming a memory device having a plurality of gate structures arranged in a vertical string, the method including forming a plurality of laterally-extending conductive control gates, each of the control gates extending from a respective gate structure of the vertical string, forming an uppermost insulating interlayer, the uppermost insulating interlayer covering the plurality of control gates, forming a vertical channel, the vertical channel including a vertical semiconductor pattern that corresponds to the gate structures and is proximate to the control gates, the vertical semiconductor pattern being formed to extend through the uppermost insulating interlayer such that a portion of the vertical semiconductor pattern is exposed by the uppermost insulating interlayer, forming an etch stop layer pattern, the etch stop layer pattern being formed to cover the portion of the vertical semiconductor pattern and cover at least a portion of the uppermost insulating interlayer adjacent to the portion of the vertical semiconductor pattern, forming a first contact hole through the uppermost insulating interlayer using an etching process, the first contact hole being formed in a position corresponding to the portion of the vertical semiconductor pattern, and forming a bit line contact in the first contact hole such that the bit line contact is electrically connected to the portion of the vertical semiconductor pattern.

The method may further include forming a bit line, the bit line being formed on the bit line contact such that the bit line may be electrically connected to the bit line contact.

The method may further include forming a vertical common source line, the common source line being parallel to the vertical channel, the common source line being separated from the gate structures by an insulation layer pattern, forming a second contact hole through the uppermost insulating interlayer using an etching process, the second contact hole being formed in a position corresponding to the common source line, and forming a contact plug in the second contact hole such that the contact plug may be electrically connected to the common source line.

The common source line may be disposed between vertical strings such that gate structures are adjacent to the common source line on at least two sides thereof, and the etch stop layer pattern may be formed to have spacer-shaped elements disposed alongside the contact plug and over portions of the gate structures that are adjacent to the contact plug.

The etch stop layer pattern may be formed to have spacer-shaped elements disposed alongside the bit line contact, the spacer-shaped elements being disposed over portions of the gate structures that are adjacent to the bit line contact and over portions of the control gates that are adjacent to the bit line contact.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
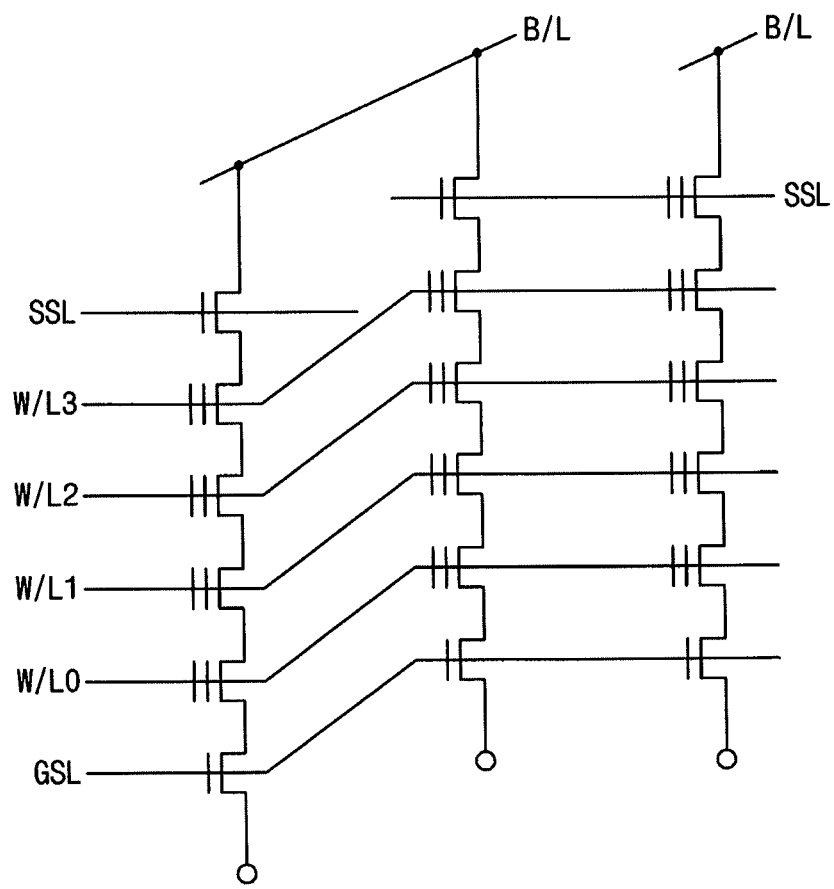
FIG. 1 illustrates a circuit diagram of a semiconductor device in accordance with example embodiments.

Korean Patent Application No. 10-2010-0093165, filed on Sep. 27, 2010, in the Korean Intellectual Property Office, and entitled: "Semiconductor Devices and Methods of Manufacturing Semiconductor Devices," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. In addition, it will also be understood that when a layer is referred to as being "between" two layers, it can be the only layer between the two layers, or one or more intervening layers may also be present. As used herein, the term "and/or" includes any and all combinations of one or more of the associated listed items.

It will be understood that, although the terms first, second, third, fourth etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present inventive concept.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, e.g., of manufacturing techniques and/or tolerances, are to be expected. Thus, example embodiments should not be construed as limited to the particular shapes of regions illustrated herein but are to include deviations in shapes that result, e.g., from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a circuit diagram of a semiconductor device in accordance with example embodiments. In FIG. 1, a circuit configuration of a vertical memory device is illustrated.

Referring to FIG. 1, a vertical memory device 10 may include a plurality of cell strings. Each of the cell strings may include a plurality of memory cells stacked on a substrate along a direction substantially perpendicular to the substrate. In example embodiments, each of the cell strings may include cell transistors and selection transistors. The cell transistors and the selection transistors may be electrically connected in series, respectively.

In the vertical memory device 10 according to example embodiments, each of the cell transistors may include a tunnel insulation layer pattern, a charge storing layer pattern, a dielectric layer pattern, a control gate, etc. The control gates of the cell transistors may serve as word lines W/L0, W/L1, W/L2, and W/L3 in the vertical memory device 10. The cell transistors may be electrically connected to one another in series along in the direction substantially perpendicular to the substrate. A ground selection transistor (GST) and a string selection transistor (SST) may be disposed adjacent to end portions of the cell transistors, respectively. A control gate of the ground selection transistor may serve as a ground selection line GSL in the vertical memory device 10. Additionally, a control gate of the string selection transistor may function as a string selection line SSL in the vertical memory device 10. In some example embodiments, a plurality of ground selection transistors and a plurality of string selection transistors may be electrically connected to one of the cell transistors in series. For example, more than two ground selection transistors and more than two selection transistors may be electrically connected to one of the cell transistors in series. Furthermore, a common source line (CSL) connected to the ground selection transistor may be provided to be electrically connected to the ground selection transistor.

In example embodiments, the word lines W/L0, W/L1, W/L2, and W/L3 in the same level may be electrically connected to each other. Additionally, bit lines B/L of the vertical memory device 10 may be electrically connected to the cell transistors.

Figure 2A:
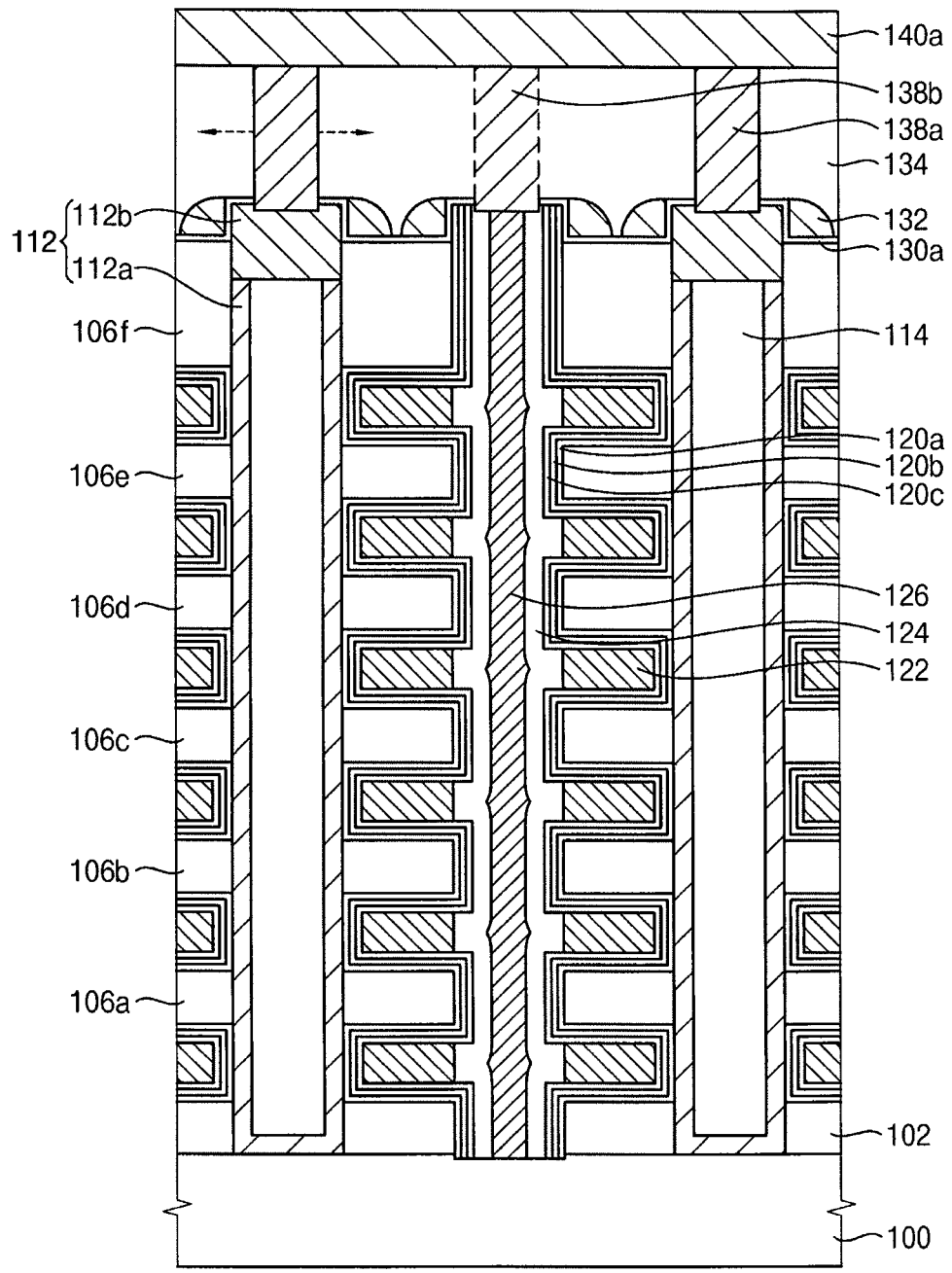
FIG. 2A illustrates a cross-sectional view of a cell in a vertical memory device in accordance with example embodiments.
Figure 2B:
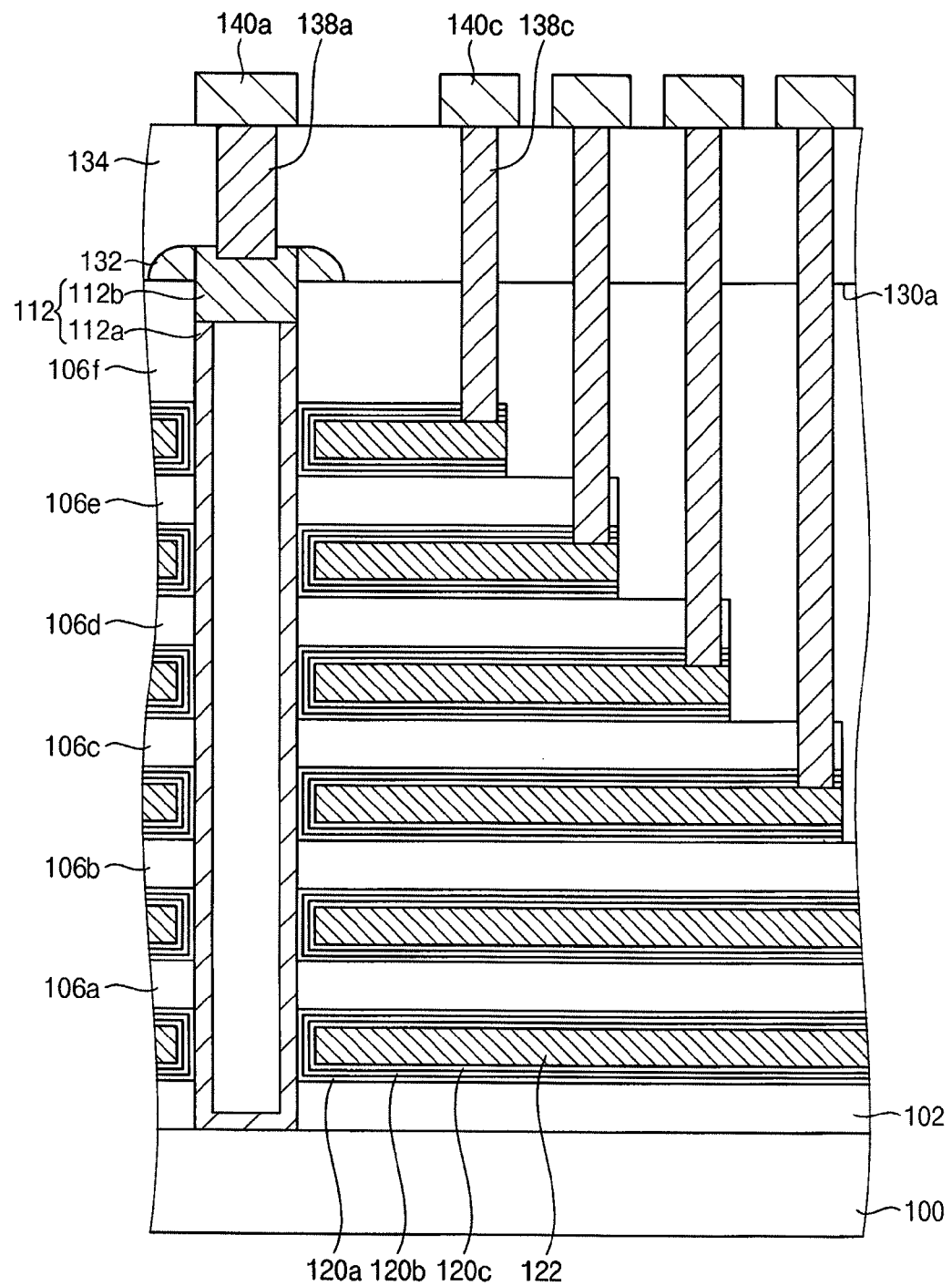
FIG. 2B illustrates a cross-sectional view of a pad of a vertical memory device in accordance with example embodiments.

In example embodiments, the circuit configuration of the vertical memory device 10 may correspond to a cross sectional configuration of a vertical memory device illustrated in FIGS. 2A and 2B. Hereinafter, "a first direction" may be referred to as a direction where the word lines W/L0, W/L1, W/L2, and W/L3 extend on the substrate and "a second direction" may be referred to as another direction where the bit lines B/L extend on the substrate. Further, "a third direction" may be referred to as still another direction substantially vertical to the substrate.

FIG. 2A illustrates a cross-sectional view of a cell in a vertical memory device. FIG. 2B illustrates a cross-sectional view of a pad of the vertical memory device. FIG. 2A illustrates a cross-sectional view of the vertical memory device along a direction substantially vertical to a word line of the vertical memory device. FIG. 2B illustrates a cross-sectional view of the vertical memory device in a direction substantially parallel to the word line.

The cell of the vertical memory device may be illustrated as including one ground selection transistor, one string selection transistor, and four cell transistors disposed between the ground selection transistor and the string selection transistor, although the cell may be implemented in other ways, e.g., the cell of the vertical memory device may include more ground selection transistors, string selection transistors, and/or cell transistors.

Referring to FIGS. 2A and 2B, a semiconductor pattern 112 (which may include a first polysilicon layer pattern 112a and a second polysilicon layer pattern 112b) may be disposed on a substrate 100. The semiconductor pattern 112 may include silicon. For example, the semiconductor pattern 112 may include single crystalline silicon, polysilicon, etc. In an example embodiment, the semiconductor pattern 112 may include polysilicon.

As illustrated in FIG. 2A, the second polysilicon layer pattern 112a may have a substantially cylindrical structure, e.g., a substantially circular cylindrical structure, substantially polygonal cylindrical structure, etc. An upper end of the semiconductor pattern 112 may be substantially closed by the first polysilicon layer pattern 112a. A channel region of the vertical memory device may be provided in the semiconductor pattern 112. When the semiconductor pattern 112 has the substantially circular or polygonal cylindrical structure, the channel region may have a reduced depth, which may help provide each transistor of the vertical memory device with improved response speed. The semiconductor pattern 112 may be doped with, e.g., p-type impurities. A filling layer pattern 114 may be disposed on an inside of the second polysilicon layer pattern 112a having the substantially circular or polygonal cylindrical structure. In an implementation, the filling layer pattern 114 may be substantially enclosed by the semiconductor pattern 112.

A plurality of cell transistors included in one cell string may be disposed on a sidewall of the semiconductor pattern 112 protruding from the substrate 100 in the third direction. The cell transistors may be electrically connected one another in series along the third direction. Each of the cell transistors may include a cell gate structure having a tunnel insulation layer 120a, a charge storing layer 120b, a blocking dielectric layer 120c, and a control gate 122. The tunnel insulation layer 120a, the charge storing layer 120b, the blocking dielectric layer 120c, and the control gate 122 may be sequentially stacked on the sidewall of the semiconductor pattern 112. Further, each cell gate structure may partially extend from the sidewall of the semiconductor pattern 112.

A ground selection transistor and a string selection transistor may be disposed adjacent to respective ends of the cell string that includes the cell transistors. For example, a lowermost transistor included in the cell string may serve as the ground selection transistor and an uppermost transistor included in the cell string may function as the string selection transistor. In example embodiments, the ground selection transistor and the string selection transistor may have a structure substantially the same as, or substantially similar to, those of the cell transistors. For example, each of the ground selection transistor and the string selection transistor may include a gate insulation layer and a gate electrode. In this case, the gate electrode may correspond to the control gate 122 of the cell transistor and the gate insulation layer may correspond to the tunnel insulation layer 120a, the charge storing layer 120b, and the blocking dielectric layer 120c. Thus, the gate insulation layers of the ground selection transistor and the string selection transistor may have multi layer structures.

Insulating interlayer patterns 106a, 106b, 106c, 106d, 106e, and 106f may be positioned among the cell gate structures of the cell transistors along the third direction. The insulating interlayer patterns 106a, 106b, 106c, 106d, 106e, and 106f may electrically insulate adjacent the cell gate structures, respectively. In example embodiments, the cell gate structures may be located in grooves provided among the insulating interlayer patterns 106a, 106b, 106c, 106d, 106e, and 106f.

An upper face of the semiconductor pattern 112 may be positioned substantially higher than an upper face of the uppermost insulating interlayer pattern 106f. Thus, the semiconductor pattern 112 may protrude above the uppermost insulating interlayer 106f. For example, an upper portion 112b of the semiconductor pattern 112 (closing the substantially circular or polygonal cylindrical structure 112a) may be located substantially higher than the upper face of the uppermost insulating interlayer 10f.

The tunnel insulation layer 120a of each cell gate structure may include oxide such as silicon oxide ($SiO_x$). The charge storing layer 120b may include nitride such as silicon nitride ($SiN_x$). The blocking dielectric layer 120c may include, e.g., silicon oxide or metal oxide. Examples of the metal oxide included in the blocking dielectric layer 120c may include aluminum oxide ($AlO_x$), hafnium oxide ($HfO_x$), zirconium oxide ($ZrO_x$), etc. The control gate 122 may have a multi layer structure that includes a barrier layer and a metal layer. For example, the barrier layer may include titanium (Ti) or titanium nitride ($TiN_x$), and the metal layer may include tungsten (W).

Referring to FIG. 2B, the control gates 122 of the cell transistors positioned at respective levels may be electrically connected to a plurality of second contact plugs 138c extending along the third direction. The second contact plugs 138c may make contact with substantial end portions of the control gate 122, respectively. A control gate 122 positioned at a lower level may extend more than an adjacent control gate 122 located at an upper level along the first direction. Thus, the lower control gate 122 may have a length substantially greater than that of the adjacent upper control gate 122. Further, the respective second contact plugs 138c may have different lengths, or different depths.

Referring again to FIG. 2A, a conductive layer pattern 126 may be disposed between adjacent semiconductor patterns 112. The conductive layer pattern 126 may serve as a common source line of the vertical memory device. The conductive layer pattern 126 may protrude along the third direction from the substrate 100. Additionally, the conductive layer pattern 126 may be substantially opposite to adjacent semiconductor patterns 112.

A first insulation layer pattern 124 may be located between the conductive layer pattern 126 and sidewalls of the cell gate structures. The first insulation layer pattern 124 may electrically insulate the conductive layer pattern 126 from the cell gate structures. In example embodiments, the conductive layer pattern 126 may have a height substantially the same as, or substantially similar to, that of the semiconductor pattern 112.

An etch stop layer pattern 132 may be provided on the uppermost insulating interlayer 106f and sidewalls of the semiconductor pattern 112 and the conductive layer pattern 126. The etch stop layer pattern 132 may have a substantially spacer shape. For example, a lower portion of the etch stop layer pattern 132 may be substantially larger than an upper portion of the etch stop layer pattern 132. In some example embodiments, the etch stop layer pattern 132 may fill a gap between the semiconductor pattern 112 and the conductive layer pattern 126 when a distance between the semiconductor pattern 112 and the conductive layer pattern 126 is relatively small.

The etch stop layer pattern 132 may include a material having a relatively high etching selectivity with respect to the insulating interlayers 106a, 106b, 106c, 106d, 106e, and 106f. For example, the etch stop layer pattern 132 may include nitride such as silicon nitride. A buffer layer 130a may be provided beneath the etch stop layer pattern 132, which may help reduce or eliminate stress that may otherwise occur between the etch stop layer pattern 132 and the semiconductor pattern 112 when the etch stop layer pattern 132 directly contacts the semiconductor pattern 112. The buffer layer 130a may include oxide such as silicon oxide.

An additional insulating interlayer 134 may be disposed on the etch stop layer pattern 132, the uppermost insulating interlayer 106f, and the buffer layer 130a. The additional insulating interlayer 134 may serve as an interlayer between metal layers. The additional insulating interlayer 134 may include, e.g., silicon oxide, silicon oxynitride, etc.

A bit line contact 138a may be disposed through the additional insulating interlayer 134 to make contact with the semiconductor pattern 112. A first contact plug 138b may be positioned through the additional insulating interlayer 134, so that the first contact plug 138b may contact the conductive layer pattern 126. Each of the bit line contact 138a and the first contact plug 138b may include, e.g., metal, alloy, and/or metal nitride.

A bit line 140a may be provided on the additional insulating interlayer 134. The bit line 140a may make contact with the bit line contact 138a. Hence, the semiconductor pattern 112 may be electrically connected to the bit line 140a through the bit line contact 138a. The bit line 140a may include, e.g., metal, alloy, and/or metal nitride.

In example embodiments, a first conductive line (not illustrated) may be formed on the additional insulating interlayer 134 to be connected with the first contact plug 138b. Thus, the first conductive line may be electrically connected to the conductive layer pattern 126 through the first contact plug 138b. The first conductive line may include, e.g., metal, alloy, and/or metal nitride.

Referring to FIG. 2B, a respective end portion of each of the control gates 122 may make contact with a respective second contact plug 138c serving as a pad contact of the vertical memory device. The second contact plugs 138c may extend in the third direction through the additional insulating interlayer 134 and one or more of the insulating interlayers 106a, 106b, 106c, 106d, 106e, and 106f.

Upper portions of the control gates 122 on which the second contact plugs 138c are positioned may not be covered with the etch stop layer pattern 132. For example, the etch stop layer pattern 132 may be located only on the semiconductor pattern 112 and the sidewall of the conductive layer pattern 126. Therefore, the etch stop layer pattern 132 may not be additionally etched when the second contact plugs 138c are formed through the additional insulating interlayer 134 and at least one of the insulating interlayers 106a, 106b, 106c, 106d, 106e, and 106f.

Second wirings 140c may be formed on the additional insulating interlayer 134 to make contact with the second contact plugs 138c, respectively. The second wirings 140c may be formed using, e.g., metal, alloy, and/or metal nitride.

According to example embodiments, the vertical memory device may include the etch stop layer pattern 132 disposed on upper sidewalls of the semiconductor pattern 112 and the conductive layer pattern 126. Because of the etch stop layer pattern 132, the insulating interlayers 106a, 106b, 106c, 106d, 106e, and 106f may not be damaged while forming the bit line contact 138a even if position of the bit line contact 138a deviates from a desired position. Further, the insulating interlayers 106a, 106b, 106c, 106d, 106e, and 106f may not be damaged while forming the first contact plug 138b even if the first contact plug 138b is misaligned relative to the conductive layer pattern 126.

Figure 3A:
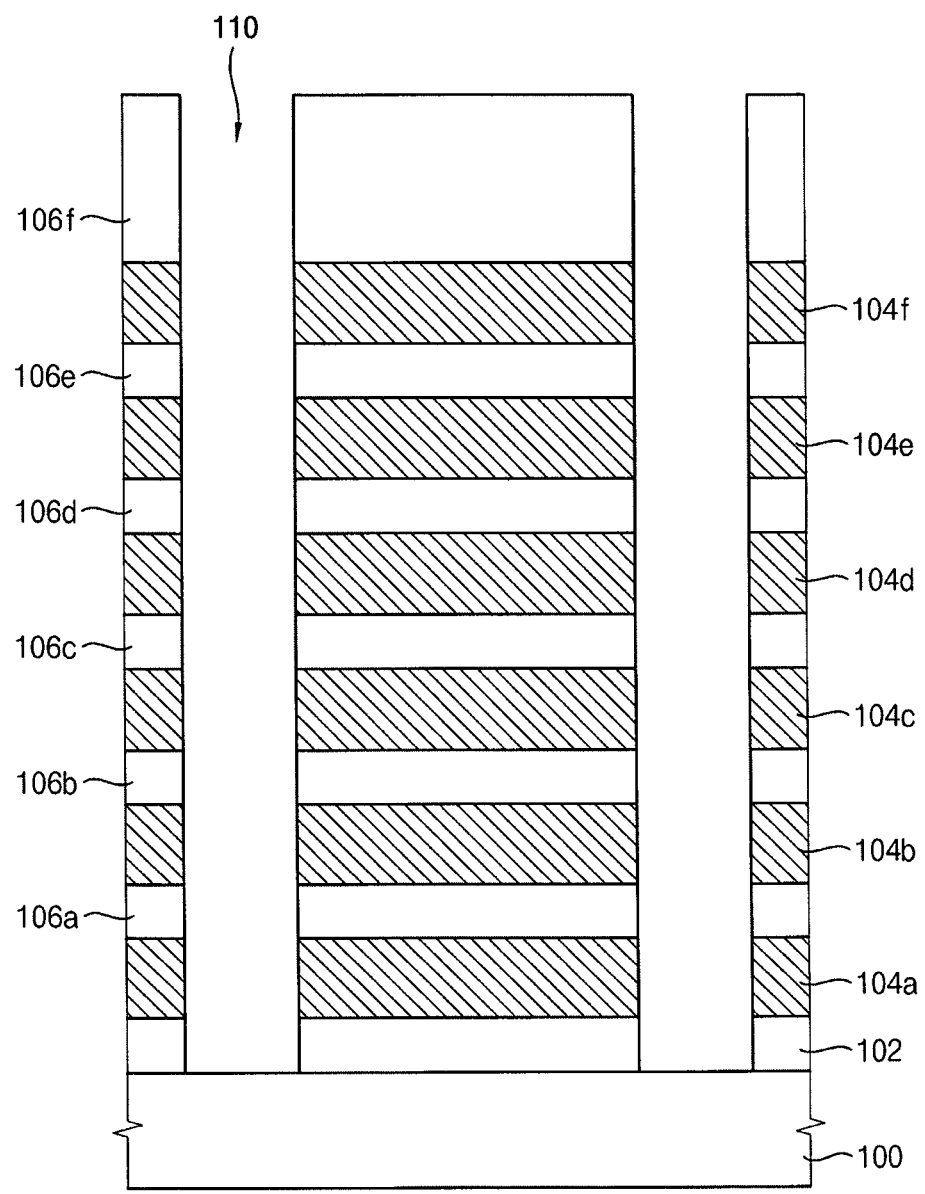
FIGS. 3A to 3L illustrate cross-sectional views of a method of manufacturing a vertical memory device in accordance with example embodiments.
Figure 3B:
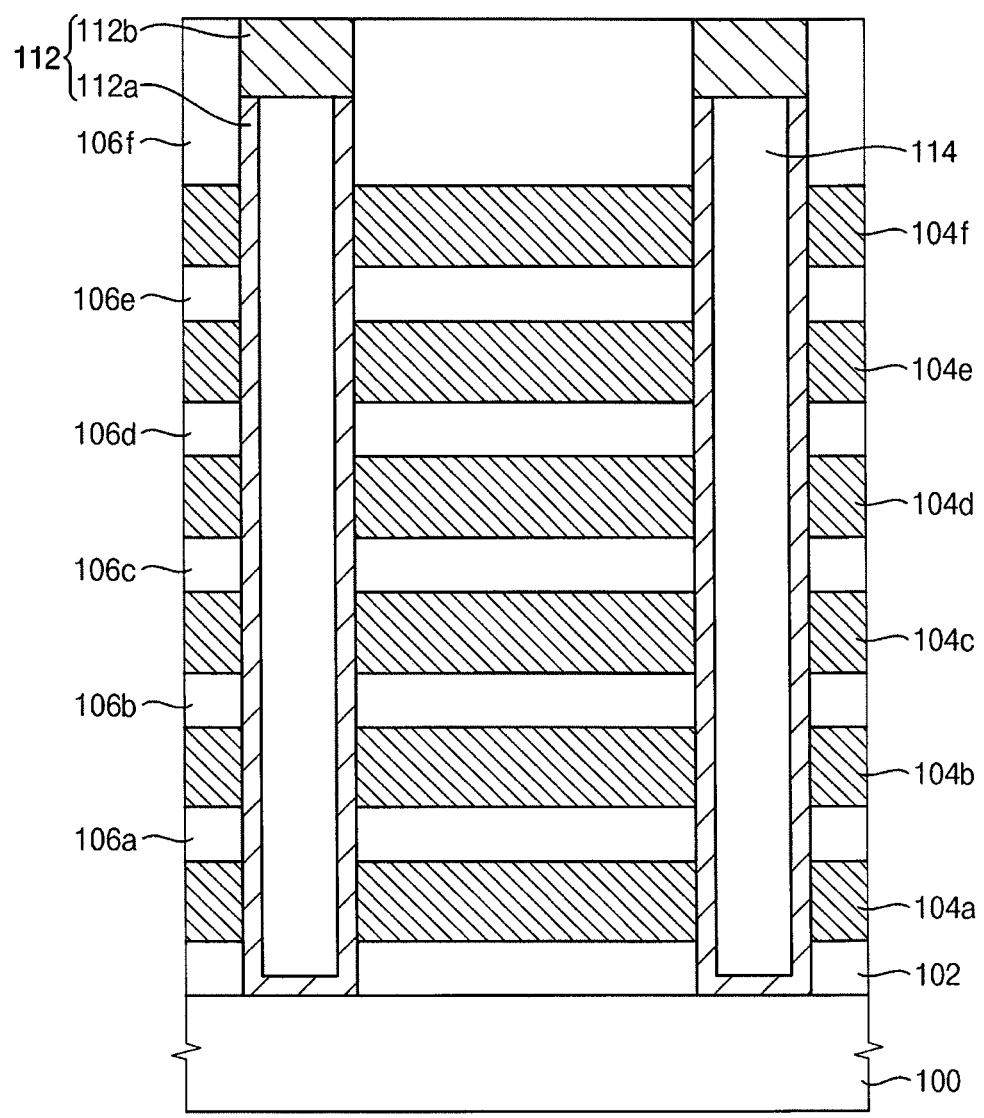
Figure 3C:
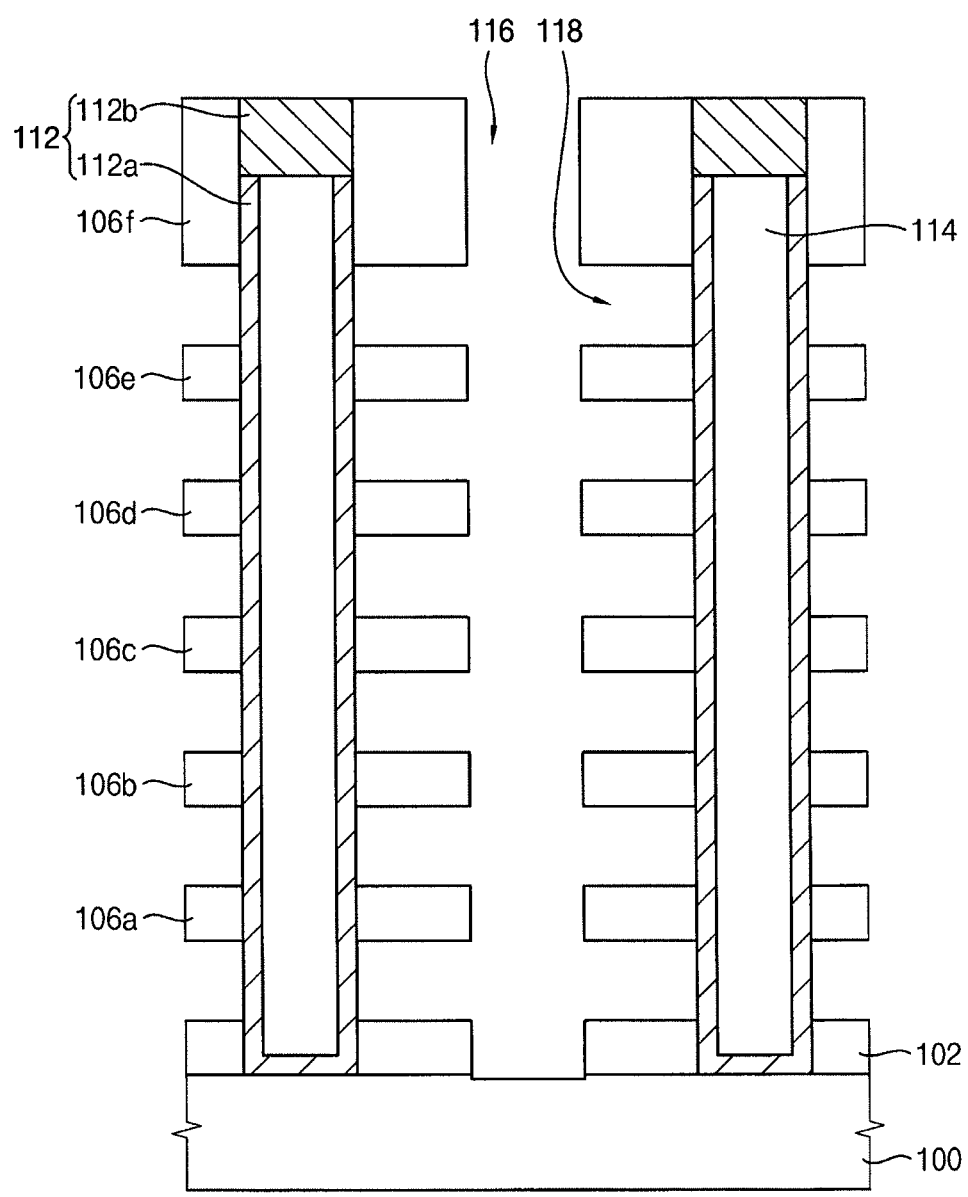
Figure 3D:
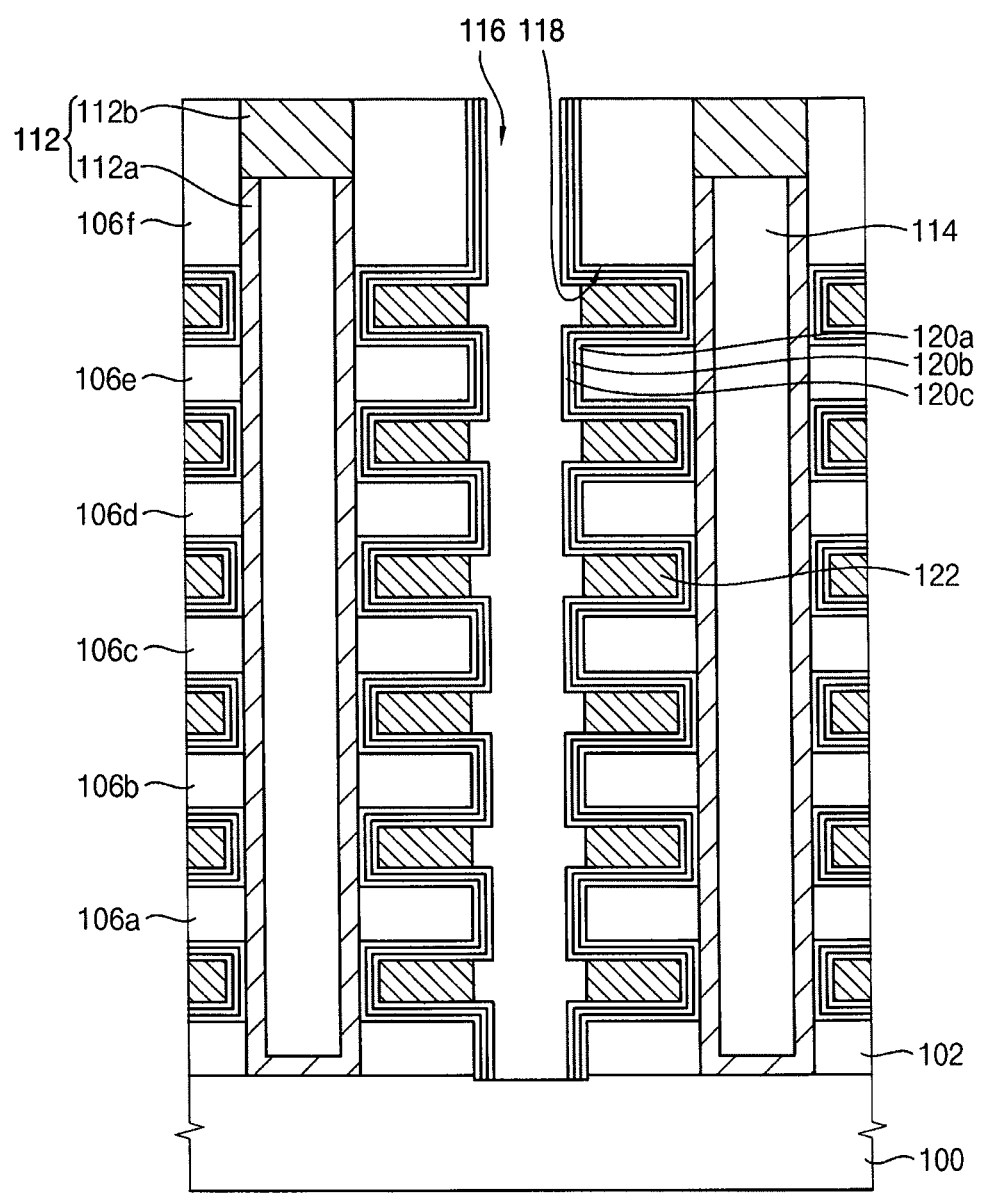
Figure 3E:
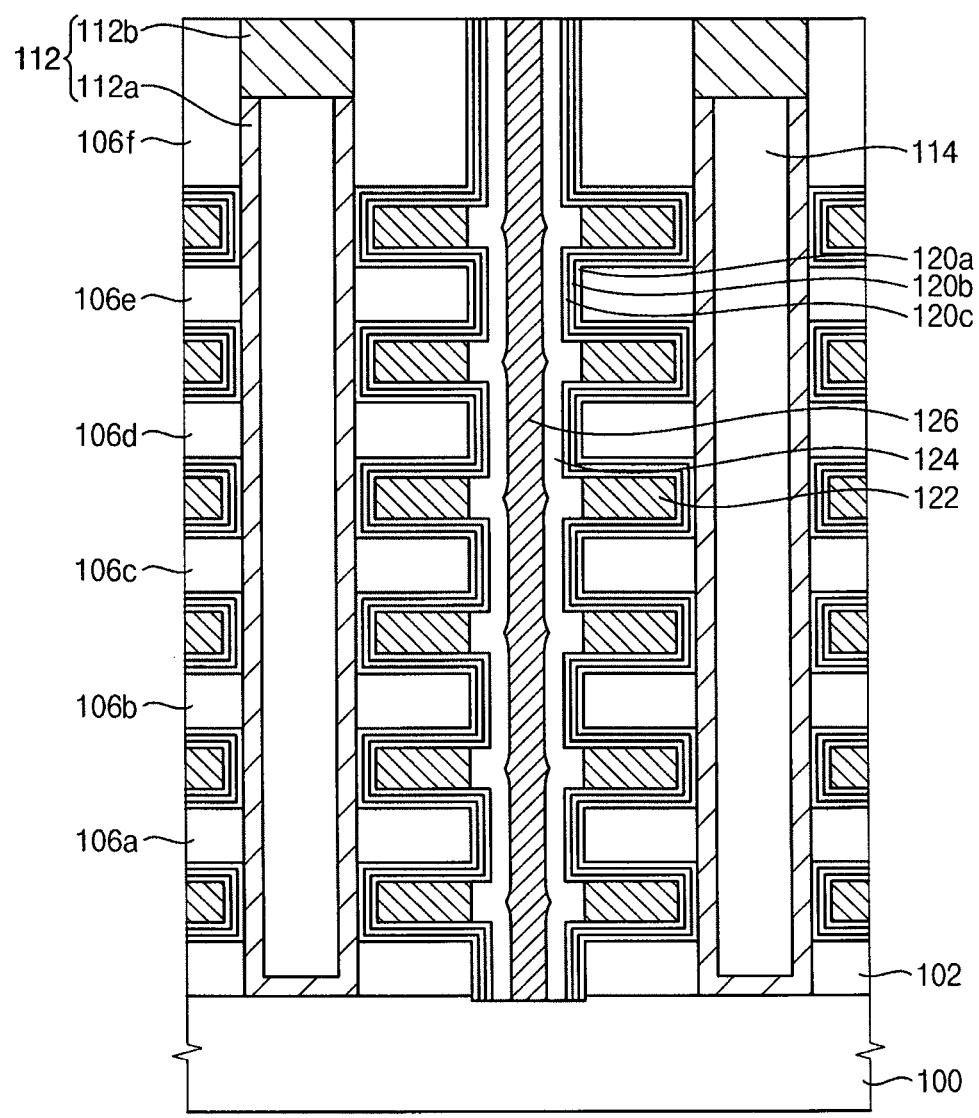
Figure 3F:
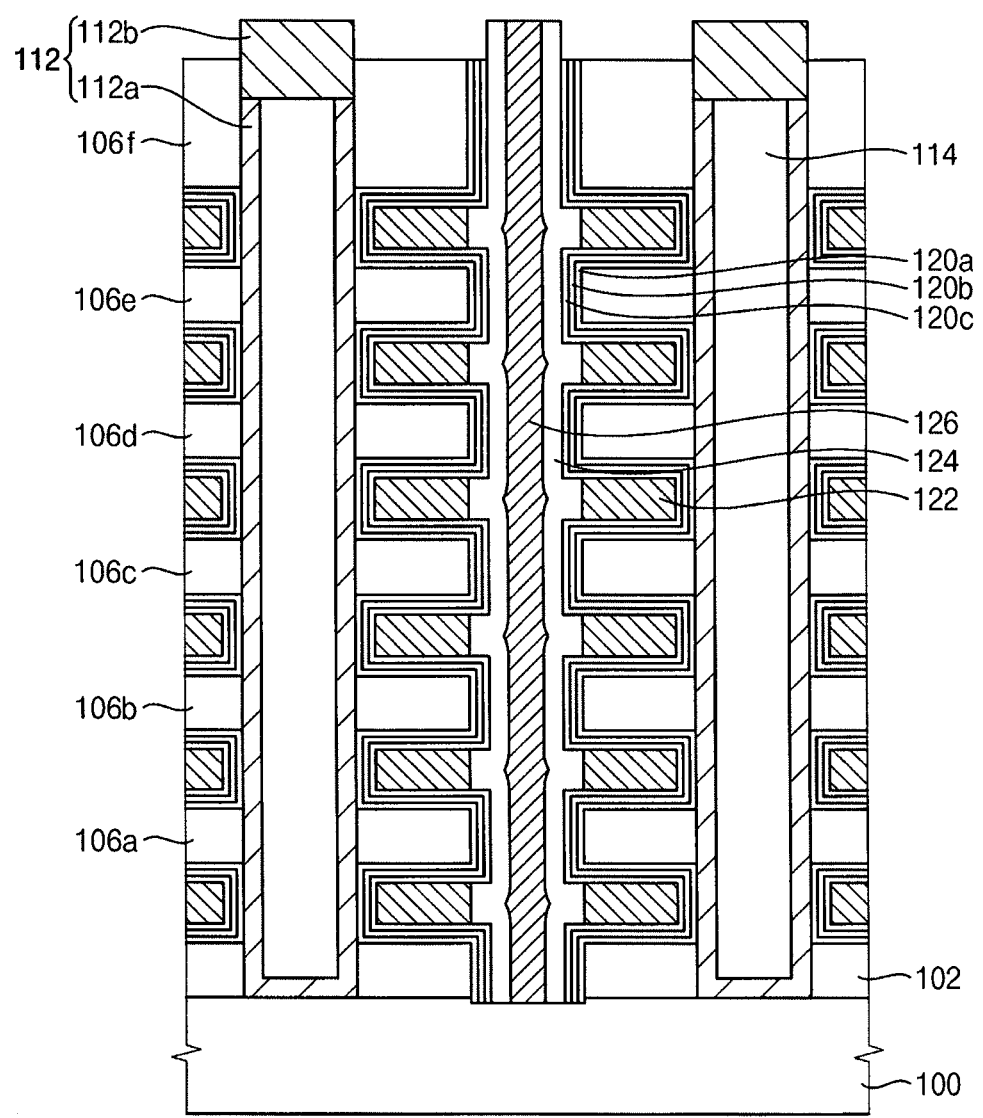
Figure 3G:
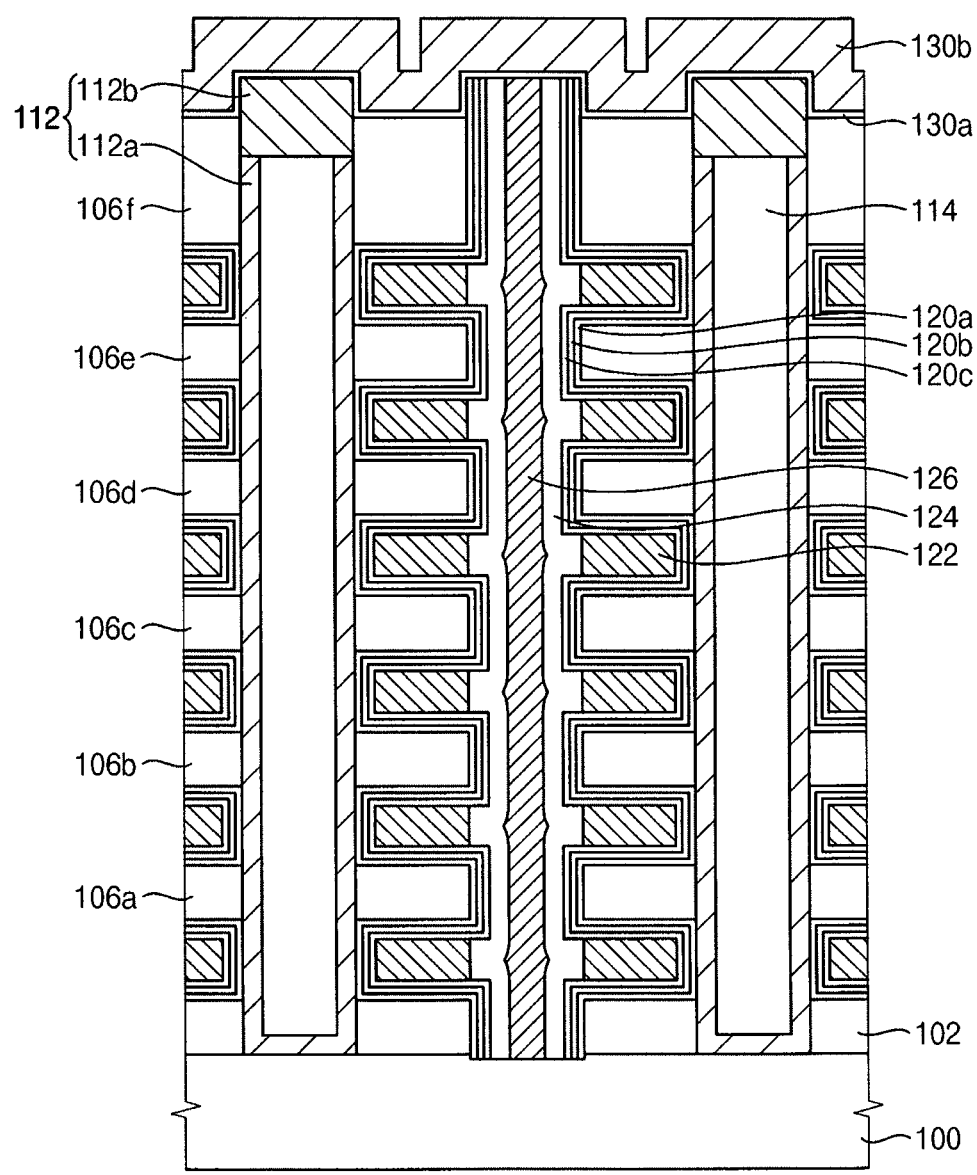
Figure 3H:
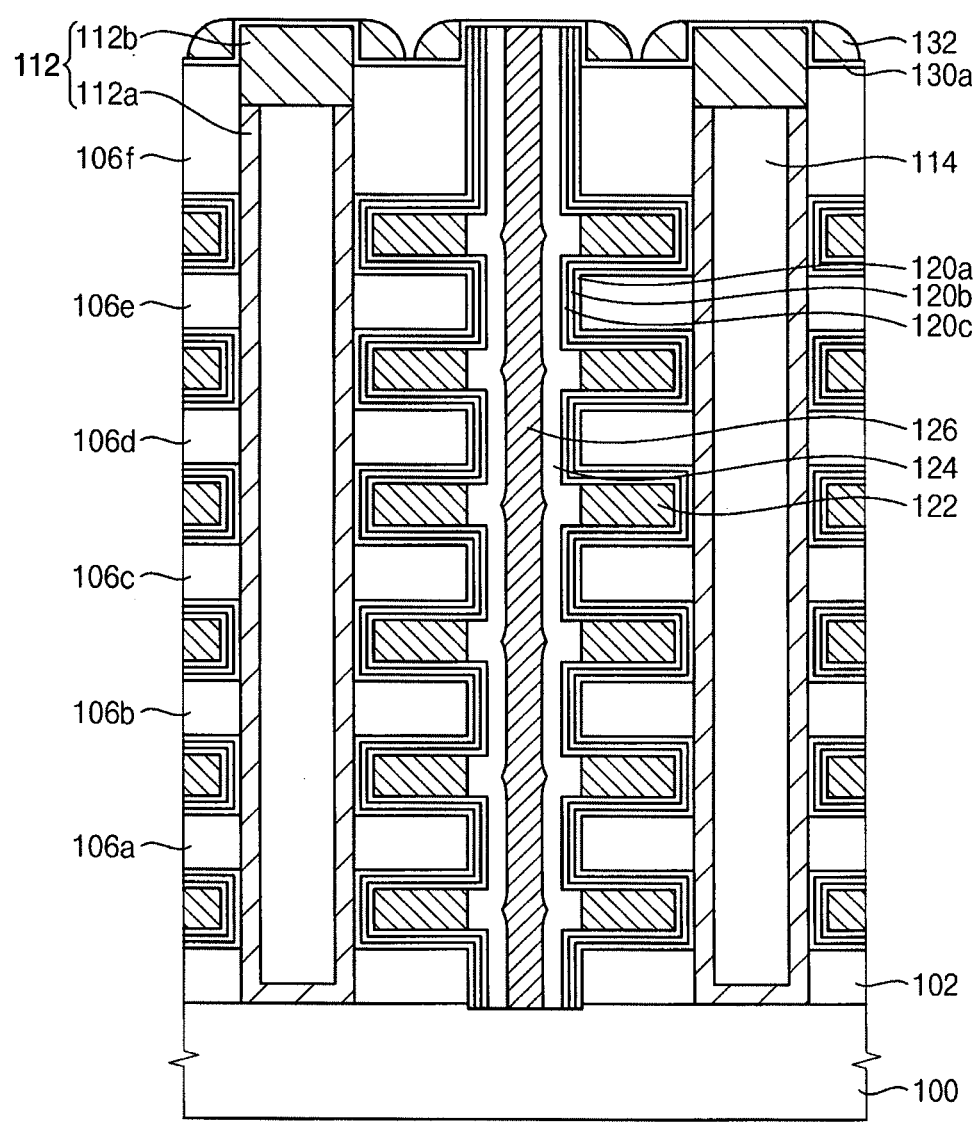
Figure 3I:
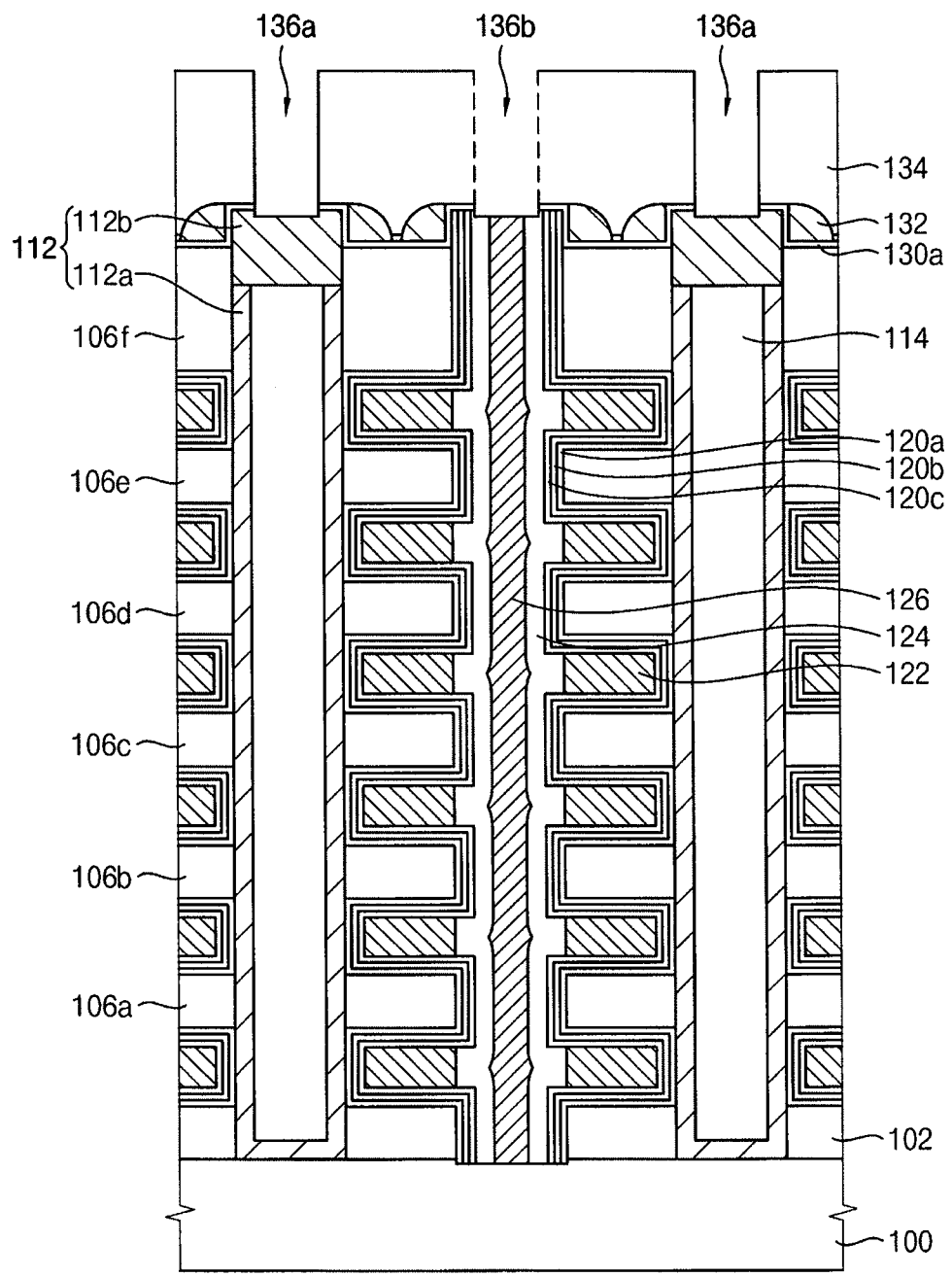
Figure 3J:
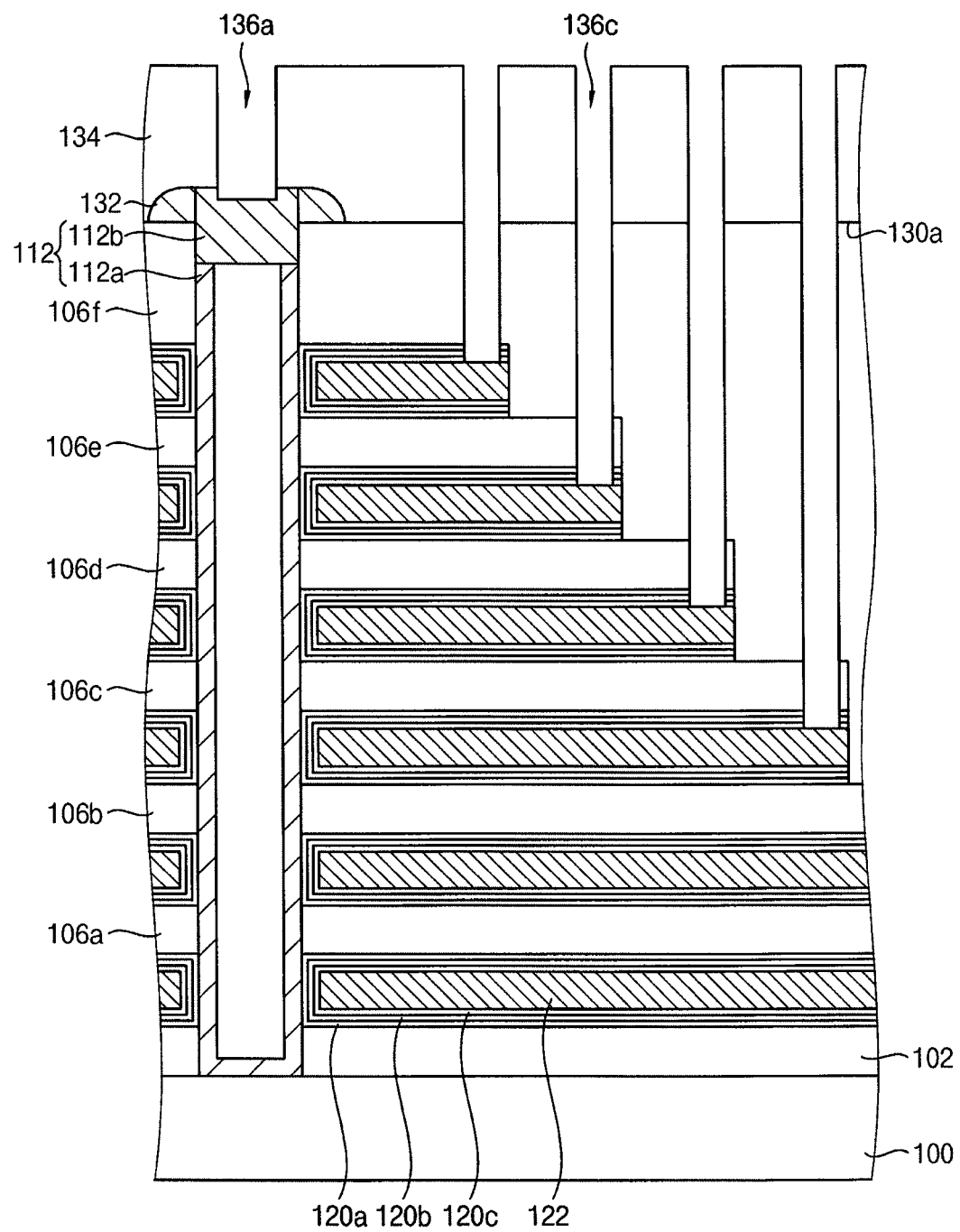
Figure 3K:
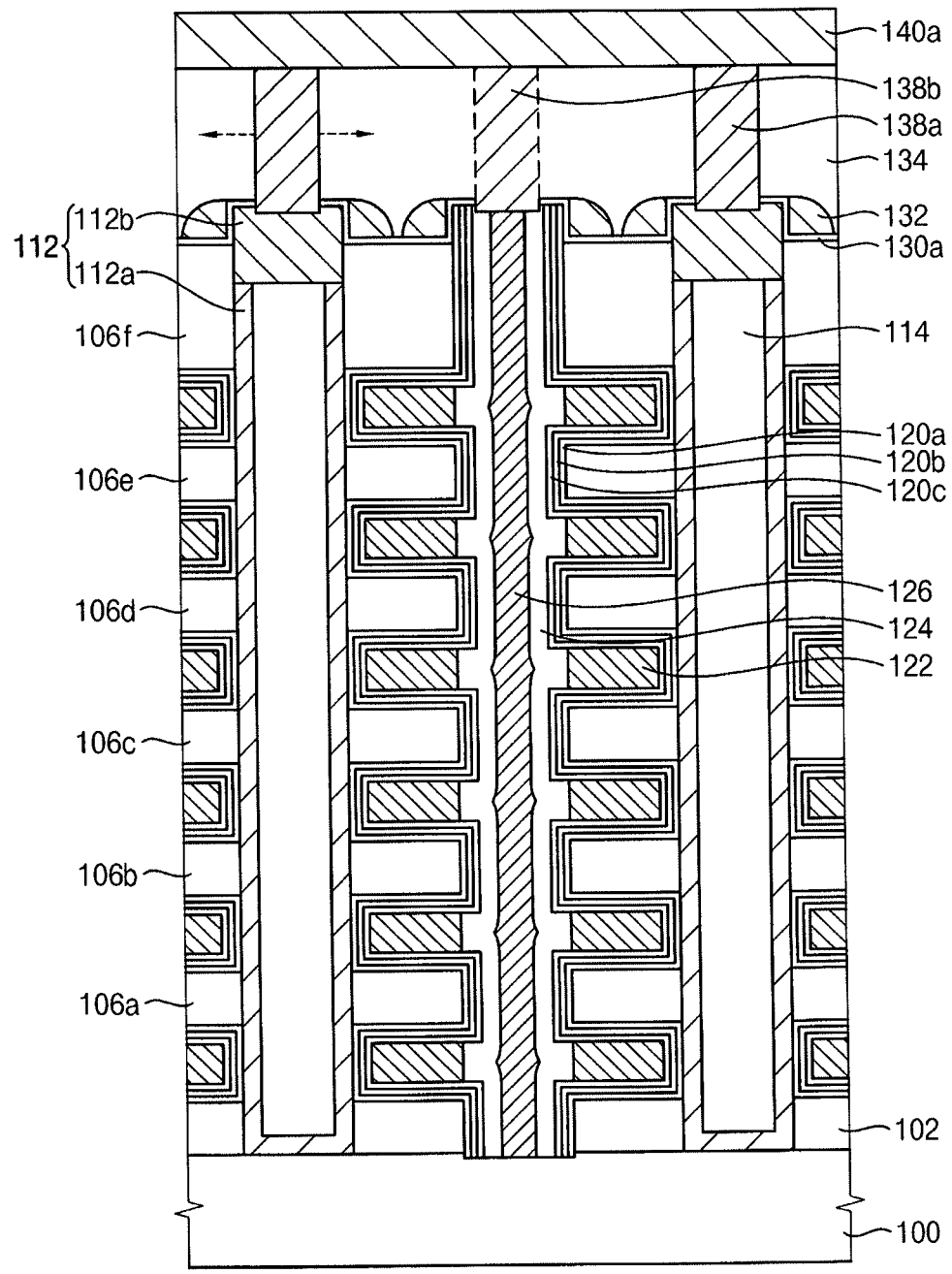
Figure 3L:
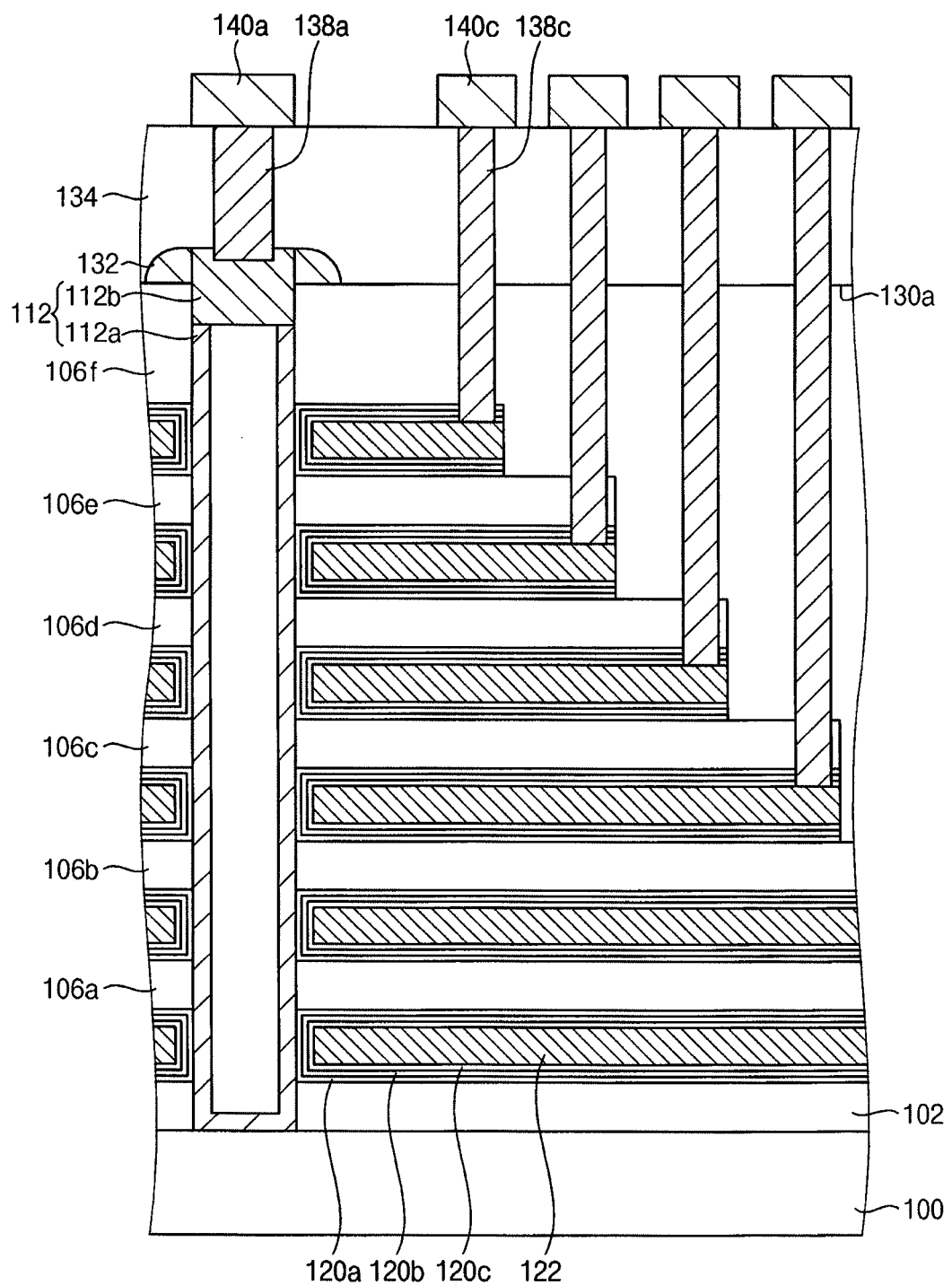

FIGS. 3A to 3L illustrate cross-sectional views of stages in a method of manufacturing a vertical memory device. FIGS. 3A to 3I and 3K illustrate cross-sectional views taken along a direction substantially perpendicular to a word line of the vertical memory device, and FIGS. 3J and 3L illustrate cross-sectional views taken along a direction substantially parallel to the word line. The method illustrated in FIGS. 3A to 3L may provide a vertical memory device having a construction substantially the same as, or substantially similar to, that of the vertical memory device described with reference to FIGS. 2A and 2B. However, other memory devices may be manufactured by applying the operations and concepts of the method illustrated in FIGS. 3A to 3L.

Referring to FIG. 3A, the pad insulation layer 102 may be formed on the substrate 100. The substrate 100 may include, e.g., a semiconductor substrate, a substrate having a semiconductor layer, etc. For example, the substrate 100 may include a silicon (Si) substrate, a germanium (Ge) substrate, a silicon-germanium (Si—Ge) substrate, a silicon-on-insulator (SOI) substrate, a germanium-on-insulator (GOI) substrate, etc. The pad insulation layer 102 may be formed by, e.g., performing a thermal oxidation process on the substrate 100, or may be formed on the substrate 100 by a deposition process such as a chemical vapor deposition process, a high density plasma-chemical vapor deposition process, etc. In example embodiments, the pad insulation layer 102 may be formed using oxide such as silicon oxide.

A plurality of sacrificial layers 104a, 104b, 104c, 104d, 104e, and 104f and a plurality of insulating interlayers 106a, 106b, 106c, 106d, 106e, and 106f may be formed alternately on the substrate 100. In example embodiments, the first sacrificial layer 104a may be formed on the pad insulation layer 102, and then the first insulating interlayer 106a may be formed on the first sacrificial layer 104a. The second sacrificial layer 104b may be formed on the first insulating interlayer 106a. In this way, the sacrificial layers 104a, 104b, 104c, 104d, 104e, and 104f and the insulating interlayers 106a, 106b, 106c, 106d, 106e, and 106f may be provided alternately along a direction substantially perpendicular to the substrate 100. Each of the sacrificial layers 104a, 104b, 104c, 104d, 104e, and 104f and each of the insulating interlayers 106a, 106b, 106c, 106d, 106e, and 106f may be formed by, e.g., a chemical vapor deposition process, a high density plasma-chemical vapor deposition process, a plasma enhanced chemical vapor deposition process, a spin coating process, etc. In an implementation, the uppermost insulating interlayer 106f may have a thickness substantially larger than those of the underlying insulating interlayers 106a, 106b, 106c, 106d, and 106e.

Gate structures of the vertical memory device may be formed at positions where the sacrificial layers 104a, 104b, 104c, 104d, 104e, and 104f are located, respectively, and thus sizes of the gate structures may be determined according to sizes of spaces where the sacrificial layers 104a, 104b, 104c, 104d, 104e, and 104f are disposed. Each of the sacrificial layers 104a, 104b, 104c, 104d, 104e, and 104f may have a thickness substantially the same as, or substantially larger than, each of effective channel lengths at each gate structure at each level.

The sacrificial layers 104a, 104b, 104c, 104d, 104e, and 104f may be formed using materials having an etching selectivity with respect to the insulating interlayers 106a, 106b, 106c, 106d, 106e, and 106f. Further, each of the sacrificial layers 104a, 104b, 104c, 104d, 104e, and 104f may have an etching selectivity relative to a semiconductor pattern 112 (see FIG. 3B) successively formed. For example, the sacrificial layers 104a, 104b, 104c, 104d, 104e, and 104f may be formed using materials having an etching selectivity with respect to polysilicon. The sacrificial layers 104a, 104b, 104c, 104d, 104e, and 104f may be formed of a material that is easily etched by a wet etching process.

In example embodiments, the insulating interlayers 106a, 106b, 106c, 106d, 106e, and 106f may be formed using silicon oxide. In another implementation, the sacrificial layers 104a, 104b, 104c, 104d, 104e, and 104f may be formed using silicon nitride.

The number of the sacrificial layers 104a, 104b, 104c, 104d, 104e, and 104f and the insulating interlayers 106a, 106b, 106c, 106d, 106e, and 106f may be substantially same as, or substantially greater than, the number of cell transistors in the cell string of the vertical memory device because each of the cell transistors may be formed in the spaces where the sacrificial layers 104a, 104b, 104c, 104d, 104e, and 104f are removed. Further, the cell string may include a string selection transistor and a ground selection transistor, besides the cell transistors, so that the number of the sacrificial layers 104a, 104b, 104c, 104d, 104e, and 104f and the number of insulating interlayers 106a, 106b, 106c, 106d, 106e, and 106f may be determined considering the number of all the transistors included in the cell string. The vertical memory device having four transistors stacked in the third direction is illustrated in FIGS. 3A to 3L. In other implementations, the number of the transistors in the vertical memory device may be increased or reduced.

A mask pattern (not illustrated) may be provided on the uppermost insulating interlayer 106f, and then the insulating interlayers 106a, 106b, 106c, 106d, 106e, and 106f, the sacrificial layers 104a, 104b, 104c, 104d, 104e, and 104f, and the pad insulation layer 102 may be partially etched using the mask pattern as an etching mask to provide a mold layer pattern on the substrate, the mold layer pattern having first openings 110. Partial etching of the insulating interlayers 106a, 106b, 106c, 106d, 106e, and 106f, the sacrificial layers 104a, 104b, 104c, 104d, 104e, and 104f, and the pad insulation layer 102 may result in the mold layer pattern on the substrate 100. Each of the first openings 110 may expose the substrate 100. The first openings 110 may be spaced apart from each other in the first and the second directions. The first openings 110 may have substantially circular cylindrical shapes or substantially polygonal cylindrical shapes, respectively.

Referring to FIG. 3B, a first polysilicon layer (not illustrated) may be formed on the sidewall and the bottom of each of the first openings 110. A filling layer (not illustrated) may be formed on the first polysilicon layer, and then an upper portion of the filling layer may be removed by an etch-back process to form a filling layer pattern 114 in the first opening 110. The filling layer pattern 144 may have an upper face substantially lower than an upper end of the first opening 110. A second polysilicon layer (not illustrated) may be formed on the filling layer pattern 114 and the first polysilicon layer to fill the first opening 110.

The second polysilicon layer and the first polysilicon layer may be partially removed until the uppermost insulating interlayer 106f is exposed, such that the first polysilicon layer pattern 112a and the second polysilicon layer pattern 112b are formed in the first opening 110 and around the filling layer pattern 114. The first and the second polysilicon layer patterns 112a and 112b may provide the semiconductor pattern 112 serving as channel regions of the vertical memory device. The semiconductor pattern 112 may have a substantially cylindrical shape of which an upper end is closed, i.e., a substantially hollow cylindrical structure.

Referring to FIG. 3C, the sacrificial layers 104a, 104b, 104c, 104d, 104e, and 104f and the insulating interlayers 106a, 106b, 106c, 106d, 106e, and 106f positioned between adjacent semiconductor patterns 112 may be etched, so that a second opening 116 may be provided between adjacent semiconductor patterns 112. In example embodiments, a mask pattern (not illustrated) may be provided on the uppermost insulating interlayer 106f, and then the insulating interlayers 106a, 106b, 106c, 106d, 106e, and 106f and the sacrificial layers 104a, 104b, 104c, 104d, 104e, and 104f may be etched using the mask pattern as an etching mask. The second opening 116 may extend along the first direction. For example, the second opening 116 may have a trench shape, a groove shape, a recess shape, etc.

The sacrificial layers 104a, 104b, 104c, 104d, 104e, and 104f exposed by the second opening 116 may be removed until the semiconductor pattern 112 is exposed. The sacrificial layers 104a, 104b, 104c, 104d, 104e, and 104f may be removed by a selective etching process in which the insulating interlayers 106a, 106b, 106c, 106d, 106e, and 106f may remain on the sidewall of the semiconductor pattern 112. For example, the sacrificial layers 104a, 104b, 104c, 104d, 104e, and 104f may be removed by a wet etching process.

The remaining insulating interlayers 106a, 104b, 104c, 104d, 104e, and 106f may remain on the sidewall of the semiconductor pattern 112 and may be disposed at predetermined intervals. Grooves (or recesses or spaces) 118 may be provided among the remaining insulating interlayers 106a, 106b, 106c, 106d, 106e, and 106f. Thus, grooves 118 may be generated adjacent to the sidewall of the semiconductor pattern 112.

Referring to FIG. 3D, the tunnel insulation layer 120a may be formed on the grooves 118 and the insulating interlayers 106a, 106b, 106c, 106d, 106e, and 106f. The tunnel insulation layer 120a may be uniformly formed on profiles of the grooves 118. For example, the tunnel insulation layer 120a may be formed using silicon oxide.

The charge storing layer 120b may be formed on the tunnel insulation layer 120a. The charge storing layer 120b may be also uniformly formed along the profiles of the grooves 118. For example, the charge storing layer 120b may be formed using silicon nitride by a chemical vapor deposition process.

The blocking dielectric layer 120c may be formed on the charge storing layer 120b. The blocking dielectric layer 120c may be uniformly formed on the charge storing layer 120b. For example, the blocking dielectric layer 120c may be formed using silicon oxide or metal oxide such as aluminum oxide, hafnium oxide, zirconium oxide, tantalum oxide, etc.

A conductive layer (not illustrated) may be formed on the blocking dielectric layer 120c to sufficiently fill the grooves 118 while partially filling the second opening 116. In example embodiments, the conductive layer may be formed using a material having relatively low electric resistance and relatively good step coverage. For example, the conductive layer may be formed using metal or metal nitride such as tungsten (W), tungsten nitride ($WN_x$), titanium (Ti), titanium nitride ($TiN_x$), tantalum (Ta), tantalum nitride ($TaN_x$), platinum (Pt), etc. In an example embodiment, the conductive layer may include a barrier layer and a metal layer. In an implementation, the barrier metal layer may be formed using titanium, titanium nitride, tantalum, tantalum nitride, etc., and the metal layer may be formed using tungsten.

The conductive layer may be partially removed to form the control gates 122 in the grooves 118. Thus, a portion of the conductive layer in the second opening 116 may be removed whereas portions of the conductive layer in the grooves 118 may remain. The control gates 122 may serve as word lines of the vertical memory device. Each of the control gates 122 may have a line shape or a bar shape extending in the first direction.

Portions of the tunnel insulation layer 120a, the charge storing layer 120b, and the blocking dielectric layer 120c covering the substrate 100 may be removed by a wet etching process. In an implementation (not illustrated), portions of the blocking dielectric layer 120c and the charge storing layer 120b exposed at a sidewall of the second opening 116 may be partially removed in the wet etching process. Here, portions of the blocking dielectric layer 120c and the charge storing layer 120b may remain only in the respective grooves 118.

End portions of each of the control gates 122 may be electrically connected to respective contact plugs that are successively formed. The control gate 122 positioned at the lowermost level may extend more than the control gate 122 at the uppermost level, and the lowermost control gate 122 may have a length substantially greater than that of the uppermost control gate 122.

Referring to FIG. 3E, an insulation layer (not illustrated) may be formed on the sidewall and a bottom of the second opening 116. The insulation layer may be partially etched to form the first insulation layer pattern 124 on the sidewall of the second opening 116. For example, the first insulation layer pattern 124 may be formed by an anisotropic etching process. In example embodiments, the first insulation layer pattern 124 may not be disposed on a portion of the substrate 100. Thus, the first insulation layer pattern 124 may expose a portion of the substrate 100 where a conductive layer pattern 126 will be formed. The first insulation layer pattern 124 may partially fill the second opening 116.

A conductive layer (not illustrated) may be formed on the first insulation layer pattern 124 to sufficiently fill the second opening 116. The conductive layer may be planarized until the uppermost insulating interlayer 106f is exposed, so that the conductive layer pattern 126 may be provided in the first insulation layer pattern 124. The conductive layer pattern 126 may make contact with the substrate 100. The conductive layer pattern 126 may have a line shape or a bar shape extending along the first direction. The conductive layer pattern 126 may serve as a common source line (CSL) of the vertical memory device.

Referring to FIG. 3F, a portion of the uppermost insulating interlayer 106f may be removed until the sidewall of the semiconductor pattern 112 and the conductive layer pattern 126 are exposed. Thus, the semiconductor pattern 112 and the conductive layer pattern 126 may partially protrude above the uppermost insulating interlayer 106f.

Impurities may be doped into an upper portion of the semiconductor pattern 112 to control a threshold voltage of a cell transistor formed adjacent to the uppermost portion of the semiconductor pattern 112. The impurities may be doped by an ion implantation process.

Referring to FIG. 3G, the buffer layer 130a may be formed on the uppermost insulating interlayer 106f, the semiconductor pattern 112, and the conductive layer pattern 126. The buffer layer 130a may be uniformly formed along profiles of the uppermost insulating interlayer 106f, the semiconductor pattern 112, and the conductive layer pattern 126. The buffer layer 130a may release a stress generated in forming an etch stop layer 130b on the semiconductor pattern 112. The buffer layer 112 may be formed using, e.g., oxide such as silicon oxide.

The etch stop layer 130b may be formed on the buffer layer 130a. The etch stop layer 130b may be formed using, e.g., silicon nitride. The etch stop layer 130b may partially fill a gap between the semiconductor pattern 112 and the conductive layer pattern 126.

Referring to FIG. 3H, the etch stop layer 130b may be partially etched to form the etch stop layer pattern 132 on the sidewalls of the semiconductor pattern 112 and the conductive layer pattern 126. For example, the etch stop layer pattern 132 may be formed by an anisotropic etching process. In example embodiments, a portion of the etch stop layer 130b adjacent to the semiconductor pattern 112 and the conductive layer pattern 126 may remain and other portions of the etch stop layer 130b may be removed, so that the etch stop layer pattern 132 may have a spacer shape. Thus, the etch stop layer pattern 132 may have an upper portion substantially smaller than a lower portion thereof.

Referring to FIG. 3I, the additional insulating interlayer 134 may be formed on the uppermost insulating interlayer 106f. For example, the additional insulating interlayer 134 may be formed using oxide. The bit line contact hole 136a may be formed by partially removing the additional insulating interlayer 134 until the semiconductor pattern 112 is exposed. Additionally, the first contact hole 136b may be formed by partially etching the additional insulating interlayer 134 to expose an upper face of the conductive layer pattern 126. In example embodiments, the bit line contact hole 136a and the first contact hole 136b may be simultaneously formed through the additional insulating interlayer 134.

While forming the bit line contact hole 136a and the first contact hole 136b, misalignment may occur between the semiconductor pattern 112 and bit line contact hole 136a and/or between the conductive layer pattern 126 and the first contact hole 136b. However, the etch stop layer pattern 132 may be provided at lower portions of the bit line contact hole 136a and the first contact hole 136b, so that the insulating interlayers 106a, 106b, 106c, 106d, 106e, and 106f under the etch stop layer pattern 132 may not be etched. The etch stop layer pattern 132 may be formed using, e.g., nitride, and may not be etched in the etching process used to form the bit line contact hole 136a and the first contact hole 136b. Therefore, the insulating interlayers 106a, 106b, 106c, 106d, 106e, and 106f and the control gates 122 may not be exposed by the etching process even if the positions of the bit line contact hole 136a and the first contact hole 136b deviate from desired positions.

Referring to FIG. 3J, a plurality of second contact holes 136c may be formed by etching the additional insulating interlayer 134 and the insulating interlayers 106a, 106b, 106c, 106d, 106e, and 106f. The second contact holes 136c may have various depths as determined from an upper face of the additional insulating interlayer 134. For example, the depths of the respective second contact holes 136c may increase toward the substrate 100. The etch stop layer pattern 132 may expose regions for the second contact holes 136, i.e., may not be positioned on a portion of the additional insulating interlayer 134 under which end portions of the control gates 122 are extended. Therefore, an additional etching process for etching the etch stop layer pattern 132 may not be required while forming the second contact holes 136c. The second contact holes 136c may be formed by performing one etching process for etching oxide layers.

Referring to FIGS. 3K and 3L, a conductive material may be deposited in the bit line contact hole 136a and the first contact hole 136b, so that the bit line contact 138a and the first contact plug 138b may be formed in the bit line contact hole 136a and the first contact hole 136b, respectively.

A conductive layer (not illustrated) may be formed on the additional insulating interlayer 134 to fill the second contact holes 136c, after which the conductive layer may be partially removed to form the second contact plugs 138c in the second contact holes 136c. The second contact plugs 138c may be formed by a planarization process, e.g., a chemical mechanical polishing process, an etch-back process, etc. The second contact plugs 138c may serve as pad contacts contacting the end portions of the control gates 122.

The bit line 140a may be formed on the additional insulating interlayer 134 to make contact with the bit line contact 138a, and the first wiring (not shown) may be formed on the additional insulating interlayer 134 to contact the first contact plug 138b. The bit line 140a and the first wiring may be formed using, e.g., metal, alloy, and/or metal nitride. The bit lines 140a may have a line shape or a bar shape extending in the second direction. The bit line 140a may be electrically connected to the semiconductor patterns 112 through the bit line contact 138a.

The second wirings 140c may be formed on the additional insulating interlayer 134 to make contact with the second contact plugs 138c, respectively. The second wirings 140c may be formed using, e.g., metal, alloy, and/or metal nitride.

According to example embodiments, the vertical memory device may include the etch stop layer pattern 132 having the spacer structure on an upper sidewall of the semiconductor pattern 112. Thus, even if misalignment of the bit line contact 138a relative to the semiconductor pattern 112 occurs, a connection of the bit line contact 138a to the insulating interlayers 106a, 106b, 106c, 106d, 106e, and 106f may be prevented. Therefore, the vertical memory device may provide improved reliability, and failures of manufacturing processes for the vertical memory device may decrease.

Figure 4A:
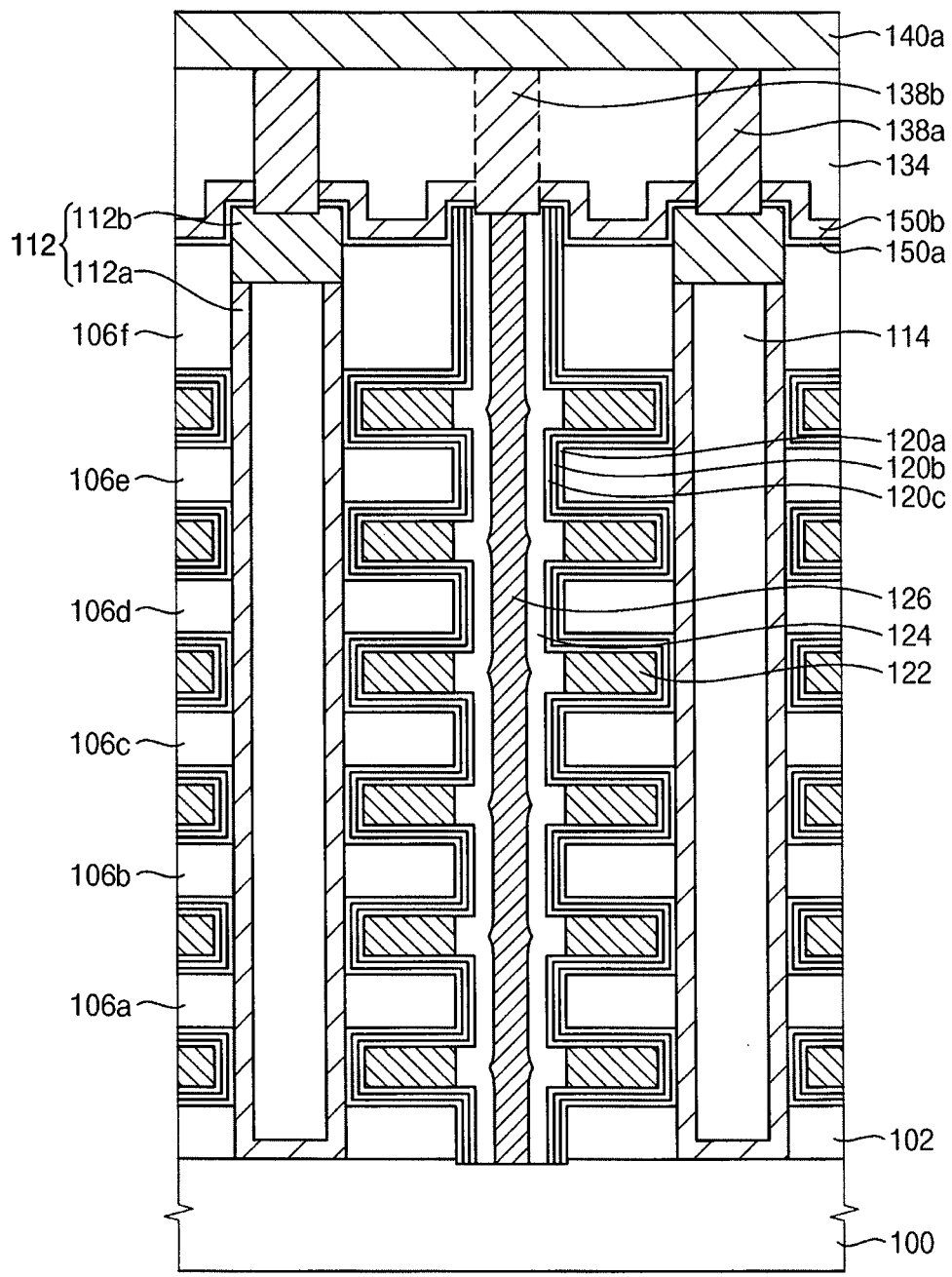
FIGS. 4A and 4B illustrate cross-sectional views of a vertical memory device in accordance with example embodiments.
Figure 4B:
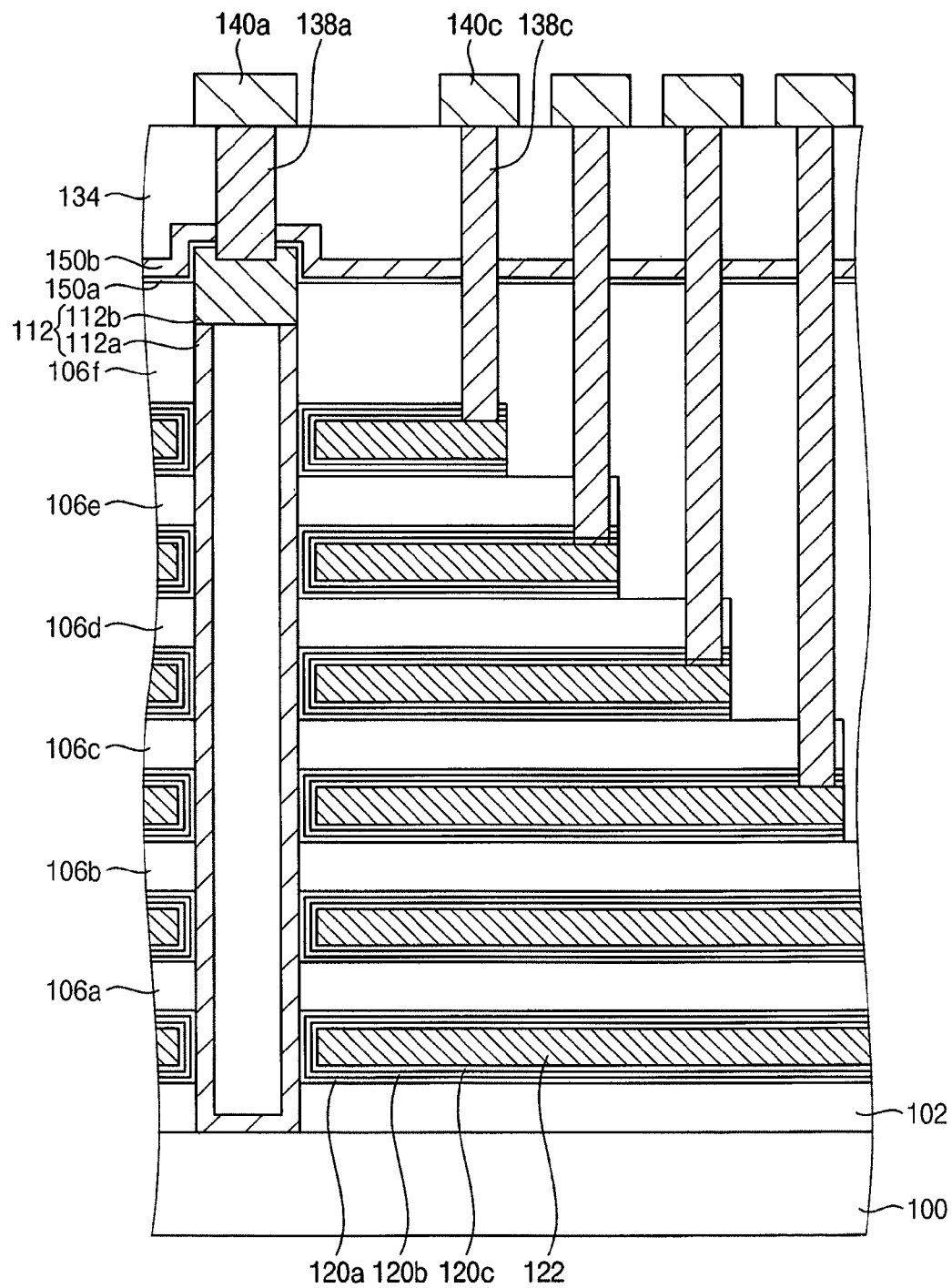

FIGS. 4A and 4B illustrate cross-sectional views of a vertical memory device in accordance with example embodiments. FIG. 4A illustrates a cross-sectional view taken along a direction substantially perpendicular to a word line of the vertical memory device, and FIG. 4B illustrates a cross-sectional view taken in a direction substantially parallel to the word line. The vertical memory device illustrated in FIGS. 4A and 4B may have a construction substantially the same as, or substantially similar to, that of the vertical memory device described with reference to FIGS. 1 to 2 except for an etch stop layer pattern.

Referring to FIGS. 4A and 4B, the semiconductor pattern 112 may be disposed on the substrate 100. The semiconductor pattern 112 may have a substantially circular or a substantially polygonal cylindrical shape of which an end is closed, i.e., a substantially hollow cylindrical shape. The filling layer pattern 114 may be located in an inside of the semiconductor pattern 112.

The vertical memory device may include a plurality of cell strings, each of which may include a plurality of cell transistors provided in a direction substantially perpendicular to the substrate 100. Each of the cell strings may include cell transistors, a ground selection transistor, and a string selection transistor connected in series. Each of the ground selection transistor and the string selection transistor may be electrically connected to a respective one of the cell transistors.

A plurality of insulating interlayer 106a, 106b, 106c, 106d, 106e, and 106f may be disposed among cell gate structures of the cell transistors along the third direction, so that adjacent cell gate structures may be separated by respective insulating interlayer. For example, grooves may be provided among the insulating interlayers 106a, 106b, 106c, 106d, 106e, and 106f, and the cell gate structures may be positioned in the grooves, respectively.

Control gates 122 at various levels may be electrically connected to a plurality of second contact plugs 138c extending in the third direction, respectively. Thus, the control gate 122 at a lower level may extend more than the control gate 122 at an upper level along the first direction. Thus, a lower control gate 122 may have a length substantially larger than a length of an adjacent upper control gate 122.

The conductive layer pattern 126 may be located between adjacent semiconductor patterns 112. The conductive layer pattern 126 may serve as a common source line of the vertical memory device. The conductive layer pattern 126 may protrude from the substrate 100 along the third direction.

The first insulation layer pattern 124 may be disposed between the conductive layer pattern 126 and sidewalls of the cell gate structures. The first insulation layer pattern 124 may electrically insulate the conductive layer pattern 126 from the cell gate structures. The conductive layer pattern 126 may have a height substantially the same as or substantially similar to that of the semiconductor pattern 112.

An etch stop layer pattern 150b may be provided on an uppermost insulating interlayer 106f, and on sidewalls of the semiconductor pattern 112 and the conductive layer pattern 126. The etch stop layer pattern 150b may be conformally disposed on the uppermost insulating interlayer 106f, the semiconductor pattern 112, and the conductive layer pattern 126. The etch stop layer pattern 150b may not cover a bit line contact 138a, a first contact plug 138b, and the second contact plugs 138c. The etch stop layer pattern 150b may include a material having an etching selectivity relative to the insulating interlayers 106a, 106b, 106c, 106d, 106e, and 106f. For example, the etch stop layer pattern 150b may include silicon nitride. A buffer layer 150a may be formed beneath the etch stop layer pattern 150b.

The additional insulating interlayer 134 may be disposed on the uppermost insulating interlayer 106f. The additional insulating interlayer 134 may have a level surface. For example, the additional insulating interlayer 134 may be provided with a flat upper face by using a planarization process such as a chemical mechanical polishing process, an etch-back process, etc.

The bit line contact 138a may be disposed through the additional insulating interlayer 134 to make contact with the semiconductor pattern 112. The first contact plug 138b may extend through the additional insulating interlayer 134 to contact the conductive layer pattern 126. Providing the vertical memory device with the etch stop layer pattern 150a may make formation of the bit line contact 138a and the first contact plug 138b easier.

The bit line 140a may be disposed on the additional insulating interlayer 134. The bit line 140a may contact the bit line contact 138a. A first wiring (not illustrated) may be located on the additional insulating interlayer 134 and may make contact with the first contact plug 138b. The second wirings 140c may be disposed on the additional insulating interlayer 134 to make contact with the second contact plugs 138c, respectively.

End portions of the control gates 122 at different levels may make contact with the second contact plugs 138c, respectively. The second contact plugs 138c may serve as pad contacts of the vertical memory device. The second contact plugs 138c may pass through the additional insulating interlayer 134 and may extend to the control gates 122 at various levels. The etch stop layer pattern 150b may be disposed over the end portions of the control gates 122.

Figure 5A:
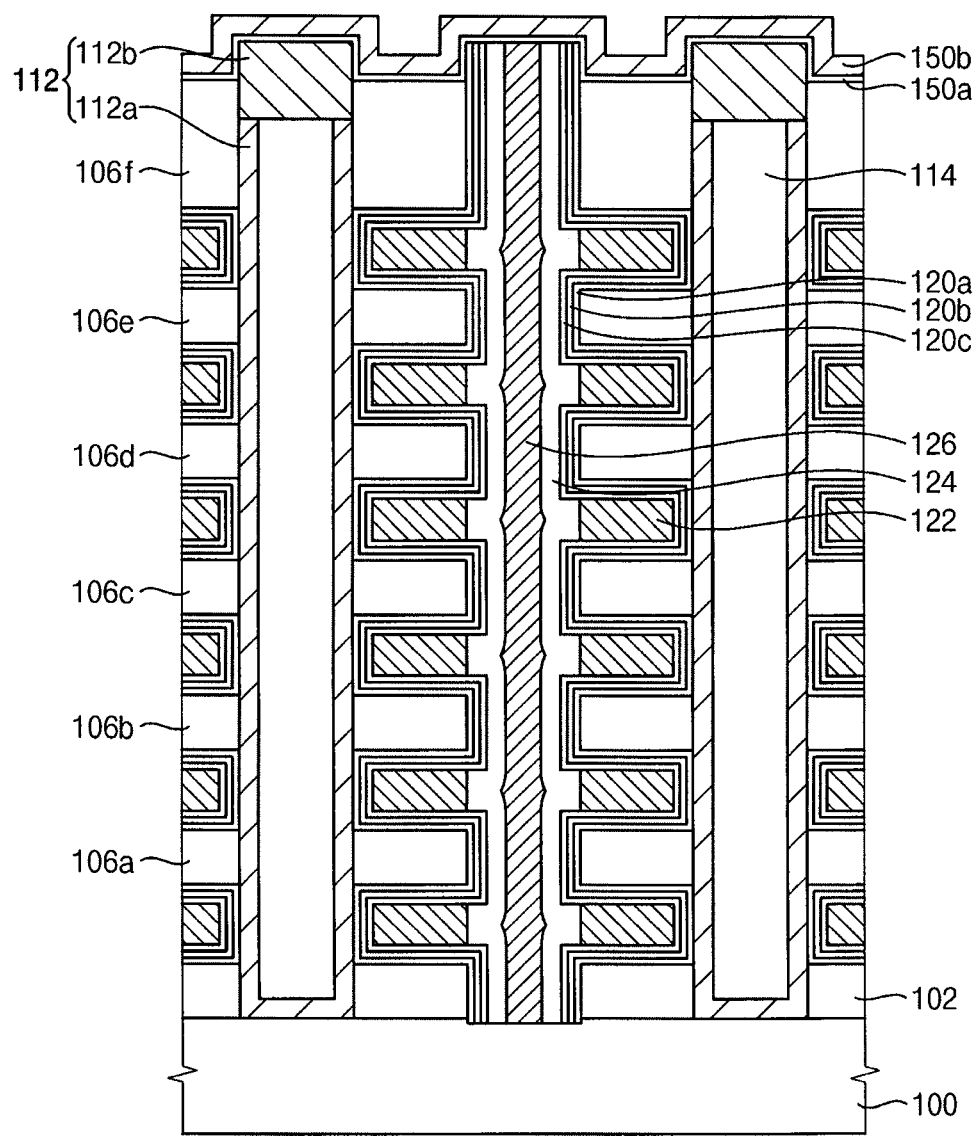
FIGS. 5A to 5C illustrate cross-sectional views of stages in a method of manufacturing a vertical memory in accordance with example embodiments.
Figure 5B:
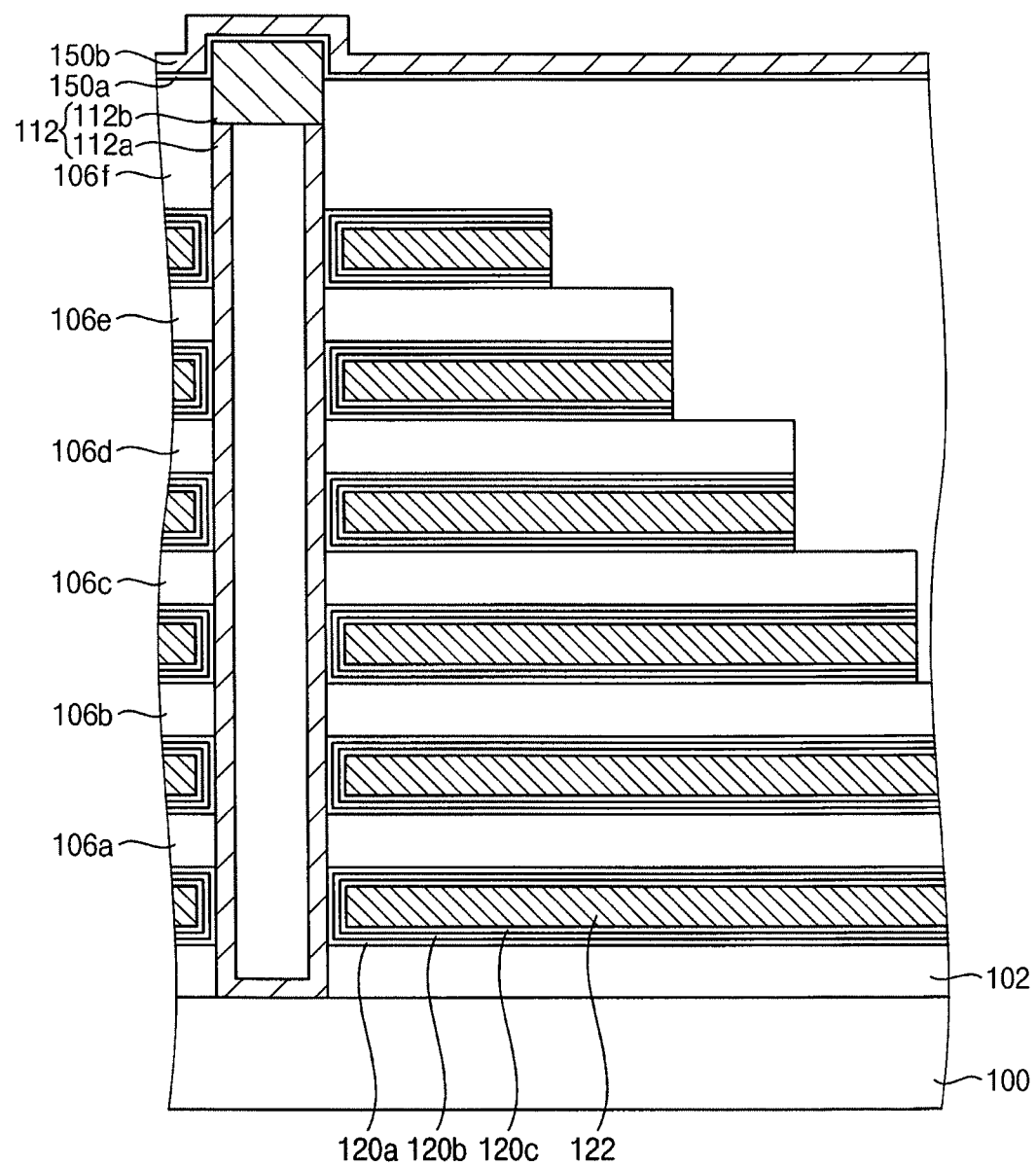
Figure 5C:
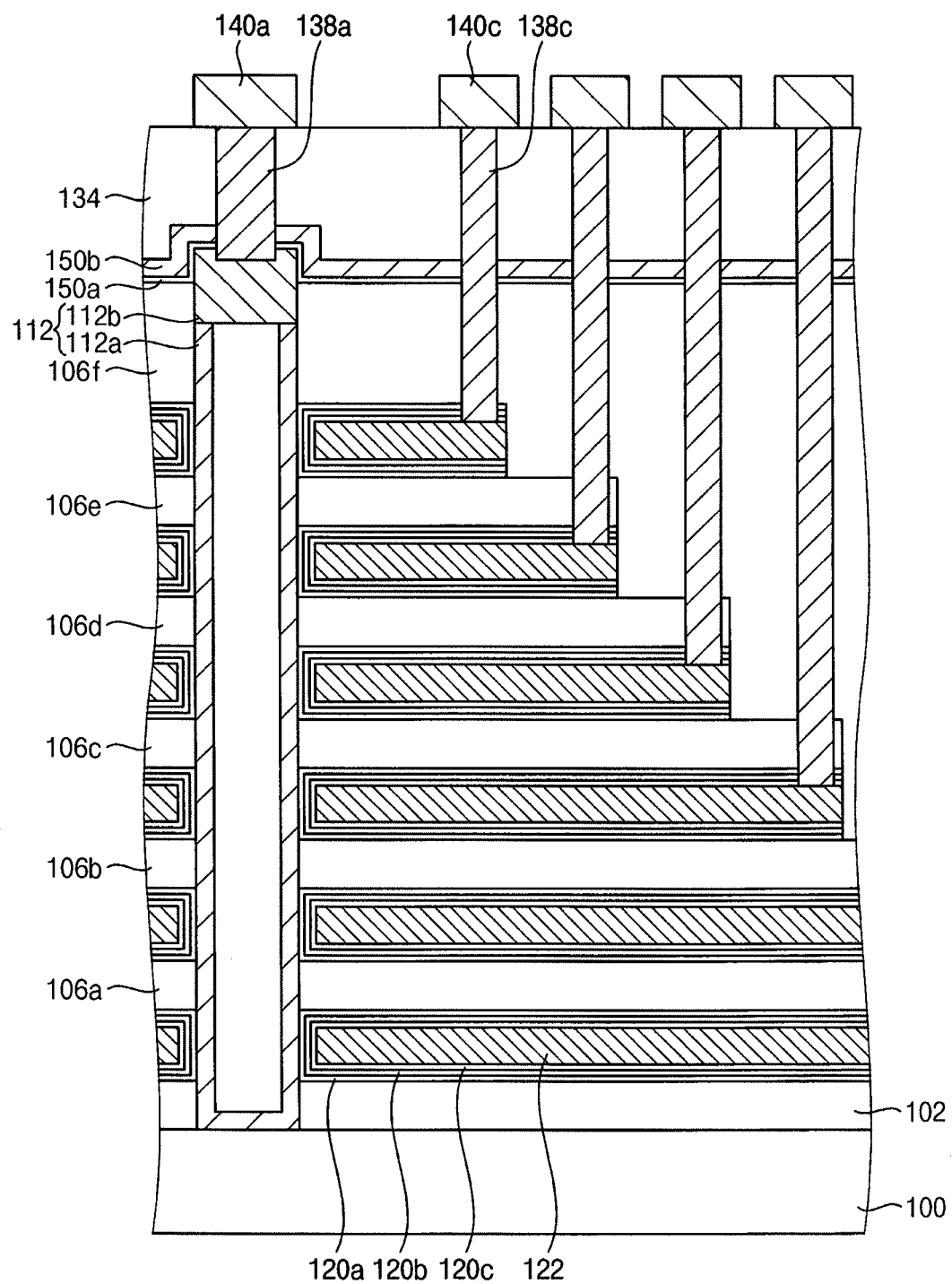

FIGS. 5A to 5C illustrate cross-sectional views of a method of manufacturing a vertical memory device in accordance with example embodiments. The method illustrated in FIG. 5A to 5C may provide a vertical memory device having a construction substantially the same as, or substantially similar to, that of the vertical memory device described above with reference to FIGS. 4A and 4B. FIG. 5A illustrates a cross-sectional view taken in a direction substantially perpendicular to a word line of the vertical memory device, and FIGS. 5B and 5C illustrate cross-sectional views taken along a direction substantially parallel to the word line.

Referring to FIGS. 5A and 5B, processes described with reference to FIGS. 3A to 3F may be performed, so that a resultant structure having a construction substantially the same as that described with reference to FIG. 3F may be provided on the substrate 100. The buffer layer 150a may be formed on the uppermost insulating interlayer 106f, the semiconductor pattern 112, and the conductive layer pattern 126. The buffer layer 150a may release a stress generated while forming the etch stop layer pattern 150b on the semiconductor pattern 112.

The etch stop layer pattern 150b may be formed on the buffer layer 150a. In example embodiments, the etch stop layer pattern 150b may be formed using, e.g., silicon nitride. The etch stop layer pattern 150b may partially fill a gap between the semiconductor pattern 112 and the conductive layer pattern 126. The etch stop layer pattern 150b may be partially removed in subsequent processes for forming second contact plugs 138c (see FIG. 5C). The etch stop layer pattern 150b may have a relatively small thickness, e.g., a thickness of less than about 500 Å, so that the etch stop layer pattern 150b may be easily removed in a subsequent etching process.

Referring to FIG. 5C, the additional insulating interlayer 134 may be formed on the uppermost insulating interlayer 106f. A portion of the additional insulating interlayer 134 may be etched to form the bit line contact hole that partially exposes the semiconductor pattern 112. Another portion of the additional insulating interlayer 134 may be etched to form the first contact hole partially exposing the conductive layer pattern 126. The bit line contact 138a and the first contact plug 138b may be formed in the bit line contact hole and the first contact hole, respectively.

The plurality of second contact holes having various depths may be formed through the additional insulating interlayer 134 and at least one of the insulating interlayers 106a, 106b, 106c, 106d, 106e, and 106f. The second contact holes may be formed by partially etching the additional insulating interlayer 134 and at least one of the insulating interlayers 106a, 106b, 106c, 106d, 106e, and 106f. The etch stop layer pattern 150b may be positioned under the additional insulating interlayer 134 located over the end portions of the control gates 122. Therefore, an additional etching process for removing the etch stop layer pattern 150b may be desired while forming the second contact holes. A conductive layer (not illustrated) may be formed in the second contact holes, after which the second contact plugs 138c may be formed in the second contact holes by partially removing the conductive layer.

The bit line 140a may be formed on the additional insulating interlayer 134 and the bit line contact 138a. A first wiring (not illustrated) may be formed on the additional insulating interlayer 134 and the first contact plug 138b. The second wirings 140c may be formed on the second contact plugs 138c and the additional insulating interlayer 134. The bit line 140a may have a substantially line shape or a substantially bar shape extending in the second direction. The bit line 140a may be electrically connected to the semiconductor patterns 112.

According to example embodiments, as shown in, e.g., FIGS. 5A and 5C, the etch stop layer pattern 150b may be conformally formed along a sidewall of the semiconductor pattern 112. By way of review, absent the etch stop layer pattern 150b, if misalignments between the bit line contact and the semiconductor pattern were to occur during an etching operation for a bit line contact hole, then the bit line contact formed in the bit line contact hole could extend through one or more of the insulating interlayers thereunder, and avoiding such an outcome could require decreasing an alignment margin of the process for manufacturing the vertical memory device. Therefore, the etch stop layer pattern 150b, which may be included in the vertical memory device in accordance with example embodiments, may help ensure high reliability by reducing process failures while manufacturing the vertical memory device, and may also allow for a greater process margin.

Figure 6:
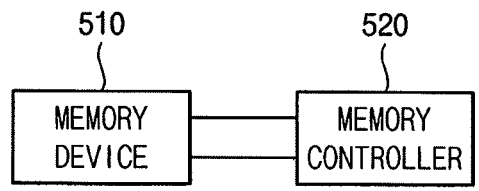
FIG. 6 illustrates a block diagram of a memory system having a vertical memory device in accordance with example embodiments.

FIG. 6 illustrates a block diagram of a memory system having a vertical memory device in accordance with example embodiments.

Referring to FIG. 6, the memory system may include a memory controller 520 and a memory device 510 electrically connected to the memory controller 520. The memory device 510 may include the above-described vertical memory device having the etch stop layer pattern, in accordance with example embodiments. The memory controller 520 may provide an input signal into the memory device 510 to control the reading and the erasing operations of the memory device 510. For example, various signals such as command (CMD), address (ADD), input/output data (DQ), and/or a high-voltage (VPP) signal may be applied to the memory controller 520. The memory controller 520 may control the memory device 510 based on the applied various signals. The memory system may be employed in various electronic apparatuses such as a cellular phone, a portable multimedia player, a digital camera, etc.

Figure 7:
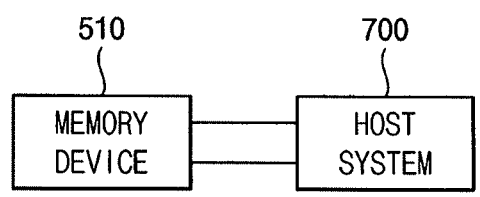
FIG. 7 illustrates a block diagram of another memory system having a vertical memory device in accordance with example embodiments.

FIG. 7 illustrates a block diagram of another memory system having a vertical memory device in accordance with example embodiments.

Referring to FIG. 7, the memory system may include a host system 700 and the memory device 510 electrically connected to the host system 700. The memory device 510 may include the above-described vertical memory device having the etch stop layer pattern, in accordance with example embodiments.

Examples of the host system 700 include electronics such as a personal computer, a personal digital assistant (PDA), a mobile device, a portable game console, a telecommunication device, a digital camera, etc. The host system 700 may apply an input signal to control and operate the memory device 510, and the memory device 510 may serve as, e.g., a data storing medium.

Figure 8:
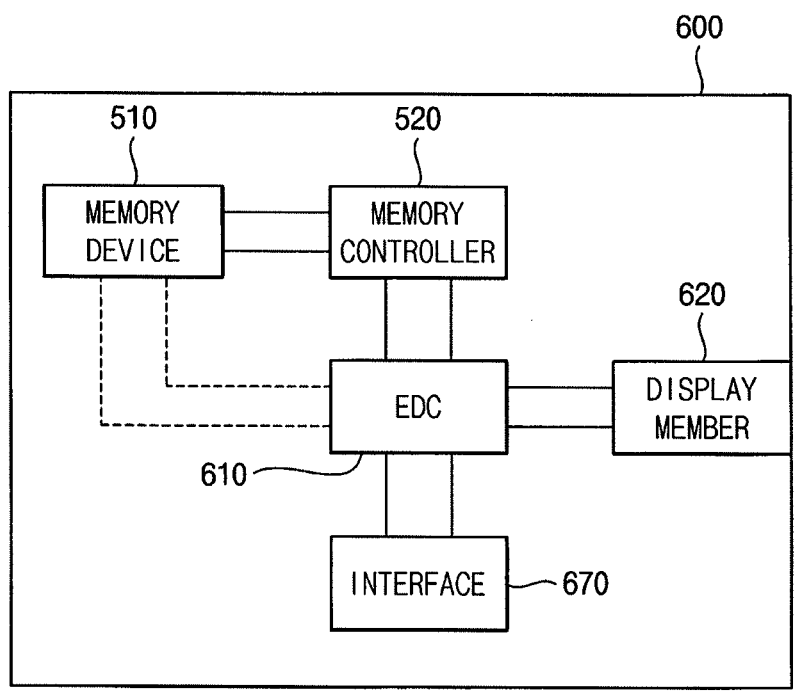
FIG. 8 illustrates a block diagram of still another memory system having a vertical memory device in accordance with example embodiments.

FIG. 8 illustrates a block diagram of still another memory system having a vertical memory device in accordance with example embodiments.

Referring to FIG. 8, the memory system may be used in, e.g., a portable electronic apparatus 600. Examples of the portable electronic apparatus 600 may include, e.g., an MP3 player, a portable video player, a portable multimedia player, a digital camera, etc. The memory system in the portable electronic apparatus 600 may include the memory device 510 and the memory controller 520. The memory device 510 may include the above-described vertical memory device in accordance with example embodiments. The memory system may also include, e.g., an encoder/decoder (EDC) 610, a display member 620, an interface 670, etc.

The EDC 610 may input/output data, such as audio data or video data, into/from the memory device 510 through the memory controller 520. In another implementation, the data may be directly inputted from the EDC 610 into the memory device 620, or may be directly outputted from the memory device 510 into the EDC 610. The EDC 610 may encode the data stored in the memory device 510. For example, the EDC 610 may carry out encoding of MP3 files to store the audio data into the memory device 510. In another implementation, the EDC 610 may encode MPEG files to store the video data into the memory device 510. Further, the EDC 610 may include a compound encoder for encoding different file types of various data. For example, the EDC 610 may include an MP3 encoder for the audio data and an MPEG encoder for the video data.

The EDC 610 may decode the data from the memory device 510. For example, the EDC 610 may perform decoding of the MP3 files based on the audio data stored in the memory device 510. In another implementation, the EDC 610 may execute decoding of MPEG files from the video data stored in the memory device 510. The EDC 610 may include an MP3 decoder for the audio data and an MPEG decoder for the video data.

In example embodiments, the EDC 610 may include a decoder without an encoder. For example, encoded data may be inputted into the EDC 610, and then the encoded data may be directly stored into the memory device 510 or may be stored into the memory device 510 through the memory controller 520 when the EDC 610 has the decoder only. The EDC 610 may receive data for decoding or encoded data through the interface 670. The interface 670 may meet a predetermined reference standard such as FireWire, USB, etc., and the interface 670 may include a FireWire interface, a USB interface, etc. Further, the data stored in the memory device 510 may be outputted through the interface 670.

As described above, example embodiments relate to vertical memory devices and method of manufacturing vertical memory devices. Example embodiments provide a semiconductor device having improved operation characteristics by preventing contact failure between a semiconductor pattern and a bit line.

By way of summation and review, a NAND flash memory device having a vertical channel may include an impurity region formed at an upper portion of a semiconductor pattern on a substrate, and may include a bit line contact making contact with an upper portion of the semiconductor pattern. As a critical dimension of the memory device is decreased, a distance between adjacent semiconductor patterns may be reduced and a size of the semiconductor pattern may also be reduced. Therefore, an alignment operation aligning the semiconductor pattern and the bit line contact may not be easy, and an alignment error between a contact plug relative to a common source line may also occur in the memory device. As a result of such errors, the memory device may have deteriorated electrical characteristics and operational failure of the memory device may occur.

However, according to example embodiments, the semiconductor device may include an etch stop layer pattern that may prevent operation failures of the completed semiconductor device in cases where misalignment occurs between a semiconductor pattern and a bit line contact hole. Thus, a process margin of manufacturing processes for the semiconductor device may be improved, and contact failure of the bit line relative to the semiconductor pattern may be prevented to enhance reliability and yield of the semiconductor device.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    alternately forming insulating interlayers and sacrificial layers on a substrate, the insulating interlayers and the sacrificial layers having a first opening exposing the substrate;
    forming a semiconductor pattern in the first opening, the semiconductor pattern contacting the substrate and protruding above an uppermost insulating interlayer;
    forming a second opening through the insulating interlayers and the sacrificial layers, the second opening exposing a portion of the substrate adjacent to the semiconductor pattern;
    forming grooves among the insulating interlayers by selectively removing the sacrificial layers, the grooves partially exposing sidewalls of the semiconductor pattern;
    forming gate structures in the grooves, respectively;
    forming a common source line in the second opening, the common source line contacting the substrate and protruding above the uppermost insulating interlayer;
    forming an etch stop layer pattern on the semiconductor pattern wherein the semiconductor pattern protrudes above the uppermost insulating interlayer and on the common source line and wherein the common source line protrudes above the uppermost insulating interlayer;
    forming an additional insulating interlayer on the uppermost insulating interlayer; and
    forming contact plugs through the additional insulating interlayer, the contact plugs contacting the semiconductor pattern and the common source line, respectively.

2. The method as claimed in claim 1, wherein the etch stop layer pattern is formed using silicon nitride.

3. The method as claimed in claim 1, further comprising forming a buffer layer on the uppermost insulating interlayer, the semiconductor pattern, and the common source line before forming the etch stop layer pattern.

4. The method as claimed in claim 1, wherein forming the etch stop layer pattern comprises:
    forming an etch stop layer on the uppermost insulating interlayer, the semiconductor pattern, and the common source line; and
    partially etching the etch stop layer to form the etch stop layer pattern on sidewalls of the semiconductor pattern and the common source line.

5. The method as claimed in claim 1, wherein the etch stop layer pattern is formed on the uppermost insulating interlayer, the semiconductor pattern, and the common source line.

6. The method as claimed in claim 1, wherein forming the common source line comprises:
    forming an insulation layer filling the second opening;
    partially etching the insulation layer in the second opening to form an insulation layer pattern on a sidewall of the second opening; and
    forming a conductive layer to fill the second opening.

7. The method as claimed in claim 1, further comprising doping impurities into an upper portion of the semiconductor pattern.

8. The method as claimed in claim 1, wherein forming the semiconductor pattern comprises:
    forming a semiconductor layer on a sidewall of the first opening;
    forming a filling layer on the semiconductor layer to fill the first opening;
    partially removing the semiconductor layer and the filling layer to form a first semiconductor pattern and a filling layer pattern in the first opening, wherein the first semiconductor pattern is lower than an upper end of the first opening; and
    forming a second semiconductor pattern on the first semiconductor pattern and the filling layer pattern.

9. The method as claimed in claim 1, wherein forming the gate structures comprises:
    forming a tunnel insulation layer, a charge storing layer, and a blocking dielectric layer on the grooves in the second opening;
    forming a conductive layer on the blocking dielectric layer; and
    partially removing the conductive layer to form control gates in the grooves.

10. A method of forming a memory device having a plurality of gate structures arranged in a vertical string, the method comprising:
    forming a plurality of laterally-extending conductive control gates, each of the control gates extending from a respective gate structure of the vertical string;
    forming an uppermost insulating interlayer, the uppermost insulating interlayer covering the plurality of control gates;

forming a vertical channel, the vertical channel including a vertical semiconductor pattern that corresponds to the gate structures and is proximate to the control gates, the vertical semiconductor pattern being formed to extend through the uppermost insulating interlayer such that a portion of the vertical semiconductor pattern is exposed by the uppermost insulating interlayer;

forming a vertical common source line, the common source line being parallel to the vertical channel, the common source line being separated from the gate structures by an insulation layer pattern;

forming an etch stop layer pattern, the etch stop layer pattern being formed to cover the portion of the vertical semiconductor pattern and cover at least a portion of the uppermost insulating interlayer adjacent to the portion of the vertical semiconductor pattern;

forming an additional insulating interlayer on the uppermost insulating interlayer;

forming a first contact hole through the uppermost additional insulating interlayer using an etching process, the first contact hole being formed in a position corresponding to the portion of the vertical semiconductor pattern;

forming a second contact hole through the additional insulating interlayer using an etching process, the second contact hole being formed in a position cones corresponding to the common source line;

forming a bit line contact in the first contact hole such that the bit line contact is electrically connected to the portion of the vertical semiconductor pattern; and forming a contact plug in the second contact hole such that the contact plug is electrically connected to the common source line.

11. The method as claimed in claim 10, further comprising forming a bit line, the bit line being formed on the bit line contact such that the bit line is electrically connected to the bit line contact.

12. The method as claimed in claim 10, wherein the common source line is disposed between vertical strings such that gate structures are adjacent to the common source line on at least two sides thereof, and the etch stop layer pattern is formed to have spacer-shaped elements disposed alongside the common source line and over portions of the gate structures that are adjacent to the common source line.

13. The method as claimed in claim 12, wherein the etch stop layer pattern is formed to have spacer-shaped elements disposed alongside the vertical semiconductor pattern, the spacer-shaped elements being disposed over portions of the gate structures that are adjacent to the bit line contact and over portions of the control gates that are adjacent to the vertical semiconductor pattern.

* * * * *